US012772882B2

(12) United States Patent
Tsai et al.

(10) Patent No.: US 12,772,882 B2
(45) **Date of Patent: *Oct. 20, 2026**

(54) SEMICONDUCTOR STRUCTURE AND METHOD OF MAKING SAME

(71) Applicant: Taiwan Semiconductor Manufacturing Company, Ltd., Hsinchu (TW)

(72) Inventors: Hao-Yi Tsai, Hsinchu City (TW); Tzuan-Horng Liu, Taoyuan City (TW); Ting Hao Kuo, Hsinchu City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 677 days.

This patent is subject to a terminal disclaimer.

(21) Appl. No.: 18/303,589

(22) Filed: Apr. 20, 2023

(65) Prior Publication Data

US 2023/0260915 A1 Aug. 17, 2023

Related U.S. Application Data

(63) Continuation of application No. 17/199,412, filed on Mar. 11, 2021, now Pat. No. 11,664,315.

(51) Int. Cl.

*H10W 70/65* (2026.01)
*H10W 20/20* (2026.01)
*H10W 74/10* (2026.01)
*H10W 90/00* (2026.01)

(52) U.S. Cl.

CPC ........... *H10W 70/65* (2026.01); *H10W 20/20* (2026.01); *H10W 74/111* (2026.01); *H10W 90/00* (2026.01); *H10W 90/792* (2026.01)

(58) Field of Classification Search

CPC ..... H10W 70/65; H10W 90/00; H10W 20/20; H10W 74/111; H10W 90/792

See application file for complete search history.

(56) References Cited

U.S. PATENT DOCUMENTS

| | | | | |
|---|---|---|---|---|
| 6,239,366 | B1 * | 5/2001 | Hsuan | H10W 90/811 361/708 |
| 9,768,145 | B2 * | 9/2017 | Yu | H01L 25/50 |
| 9,966,360 | B2 * | 5/2018 | Yu | H10P 72/74 |
| 11,270,976 | B2 * | 3/2022 | Liao | H10W 74/01 |
| 11,387,214 | B2 * | 7/2022 | Wang | H01L 25/0652 |
| 11,417,587 | B2 * | 8/2022 | Chen | H10P 72/74 |
| 11,552,019 | B2 * | 1/2023 | Hariri | H10W 70/65 |
| 11,688,693 | B2 * | 6/2023 | Chen | H10P 72/74 257/668 |

(Continued)

*Primary Examiner* — Nathan W Ha

(74) *Attorney, Agent, or Firm* — JCIPRNET

(57) ABSTRACT

A semiconductor structure includes a first die, a first encapsulant, a second die and a second encapsulant. The first die includes a first dielectric layer and first conductive pads in the first dielectric layer. The first encapsulant laterally encapsulates and is in direct contact with the first dielectric layer of the first die. The second die includes a second dielectric layer and second conductive pads in the second dielectric layer. The second encapsulant laterally encapsulates and is in direct contact with the second dielectric layer of the second die. The first conductive pads of the first die are in physical contact with a first portion of the second conductive pads of the second die.

20 Claims, 25 Drawing Sheets

(56) References Cited

U.S. PATENT DOCUMENTS

| | | | | |
|---|---|---|---|---|
| 11,978,685 | B2 * | 5/2024 | Pietambaram | H10W 70/692 |
| 12,272,656 | B2 * | 4/2025 | Mallik | H10W 42/121 |
| 2011/0068459 | A1 * | 3/2011 | Pagaila | H10W 74/01<br>257/E23.141 |
| 2012/0068229 | A1 * | 3/2012 | Bemanian | H10W 90/00<br>257/209 |
| 2014/0217610 | A1 * | 8/2014 | Jeng | H01L 25/0652<br>257/774 |
| 2015/0262902 | A1 * | 9/2015 | Shen | H10W 76/12<br>438/107 |
| 2015/0262972 | A1 * | 9/2015 | Katkar | H10W 42/121<br>438/107 |
| 2017/0062383 | A1 * | 3/2017 | Yee | H01L 25/50 |
| 2019/0319008 | A1 * | 10/2019 | Liao | H10W 74/01 |
| 2021/0005542 | A1 * | 1/2021 | Mallik | H01L 24/19 |
| 2021/0035859 | A1 * | 2/2021 | Mehta | H10W 20/056 |
| 2021/0125965 | A1 * | 4/2021 | Lu | H10W 70/611 |
| 2021/0391317 | A1 * | 12/2021 | Wu | H01L 25/50 |
| 2022/0077063 | A1 * | 3/2022 | Haba | H01L 25/0652 |
| 2025/0014961 | A1 * | 1/2025 | Wang | H10W 20/20 |
| 2025/0357427 | A1 * | 11/2025 | Huang | H01L 25/0655 |

* cited by examiner

SEMICONDUCTOR STRUCTURE AND METHOD OF MAKING SAME

CROSS-REFERENCE TO RELATED APPLICATION

This application is a continuation application of and claims the priority benefit of U.S. application Ser. No. 17/199,412, filed on Mar. 11, 2021, now allowed. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
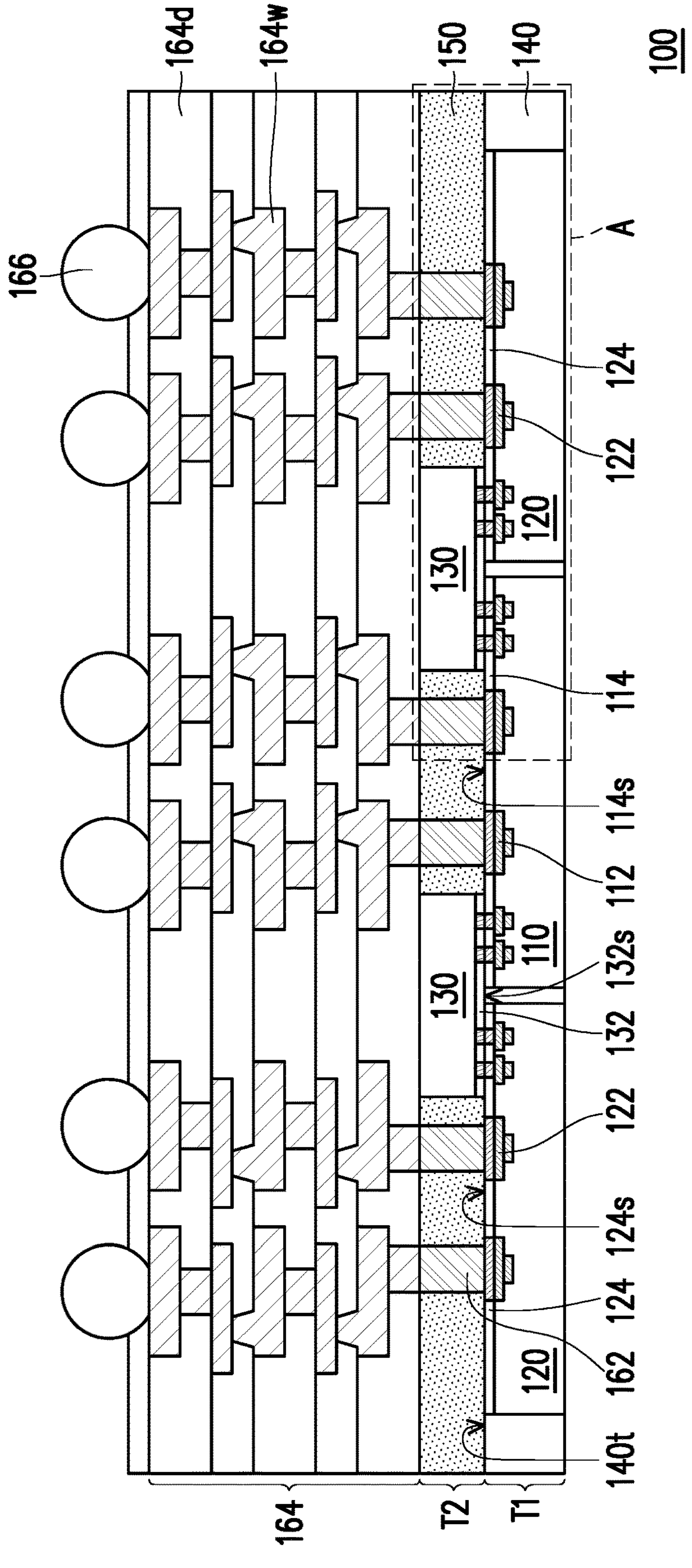
FIG. 1A schematically shows a semiconductor structure, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
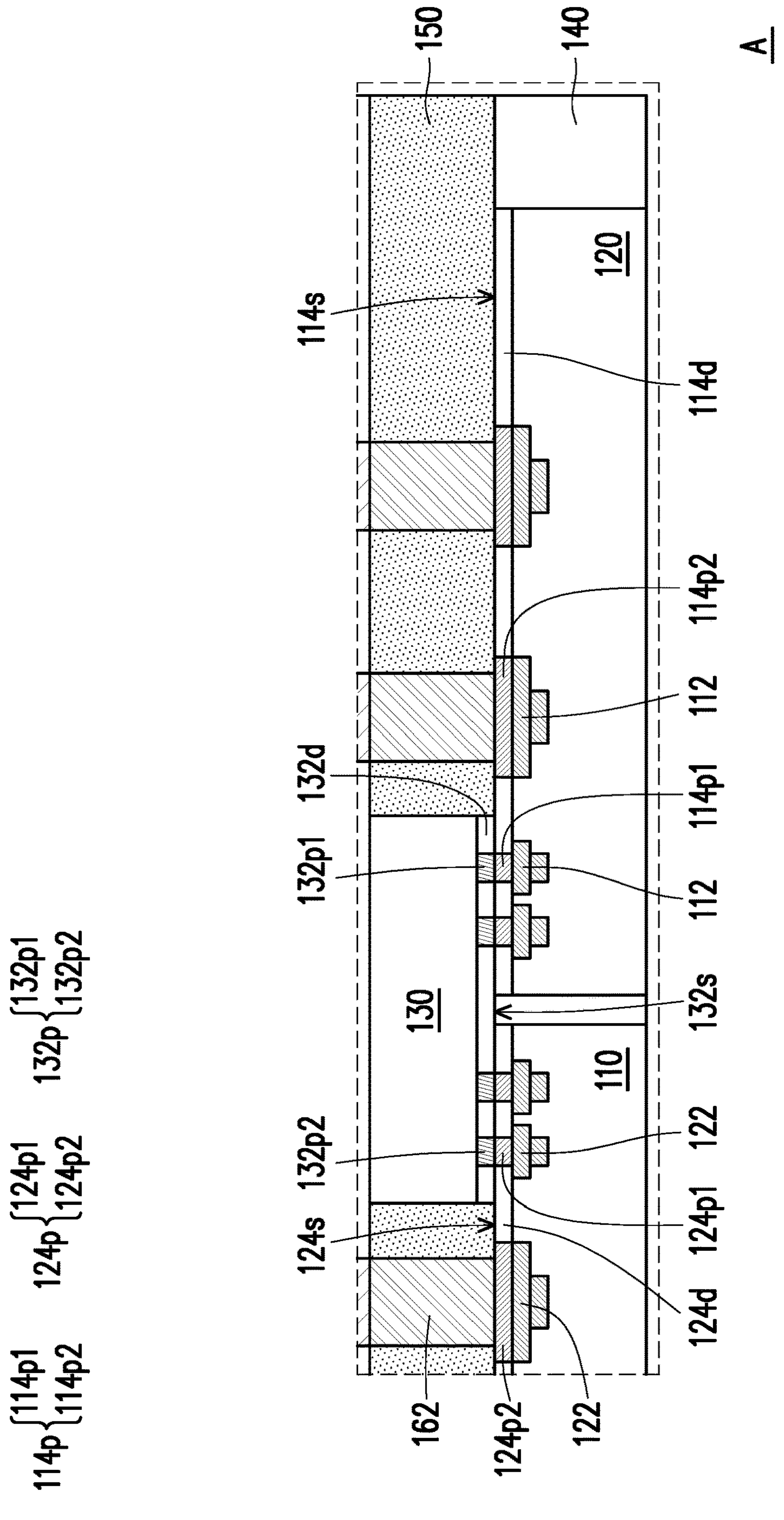
FIG. 1B schematically shows a magnified view of a portion of the semiconductor structure shown in FIG. 1A, in accordance with an embodiment.

FIG. 1A shows a semiconductor structure 100 in accordance with an embodiment. FIG. 1B shows a magnified view of portion A of the semiconductor structure 100 shown in FIG. 1A in accordance with an embodiment. Referring to FIG. 1A and FIG. 1B, the semiconductor structure 100 may be a multi-chip fan-out package or an integrated fan-out (InFO) package, as an example. The semiconductor structure 100 may include a first die 110, a second die 120, and an interconnection die 130. Each of the first die 110, the second die 120, and the interconnection die 130 of the semiconductor structure 100 may have been subjected to one or more functional tests (e.g. electrical connection and stress tests) and may have passed such functional tests. In such an example, each of the first die 110, the second die 120, and the interconnection die 130 may be a known good die (KGD).

The first die 110 and the second die 120 may be a semiconductor die and could include any type of integrated circuit. As an example, the first die 110 and the second die 120 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, High-Bandwidth Memory (HBM) die, Hybrid Memory Cubes (HMC) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), the like, or combinations thereof. The first die 110 and the second die 120 may differ in function. As an example, the first die 110 may be a SoC while the second die 120 may be a memory chip, such as DRAM, SRAM, HBM, etc. However, in some embodiments, the first die 110 and the second die 120 may be of the same kind of semiconductor die. As an example, the first die 110 and the second die 120 may both be SoC.

The semiconductor structure 100 may include at least one first die 110 and at least one second die 120 that are laterally separated from each other. However, in another example, the semiconductor structure 100 may include more than one first die 110 or may include more than one second die 120 that may be laterally separated from each other. In the example shown in FIG. 1A, the semiconductor structure 100 includes a first die 110 and two second dies 120 that are laterally separated from each other and arranged along a horizontal direction.

The first die 110 may include a substrate, one or more active devices, and an interconnect structure. The substrate, one or more active devices, and interconnect structure of the first die 110 are not shown in FIG. 1A for the sake of simplicity. The substrate of the first die 110 may be a bulk silicon substrate, although other semiconductor materials including group III, group IV, and group V elements may also be used. Alternatively, the substrate may be a silicon-on-insulator substrate, a germanium-on-insulator substrate, or the like.

The one or more active devices of the first die 110 may be within and/or atop the substrate of the first die 110. The one or more active devices may comprise one or more transistors, as an example. The interconnect structure of the first die 110 may be over the substrate and the one or more active devices of the first die 110. The interconnect structure may electrically connect the one or more active devices of the first die 110 to form functional circuits in the first die 110.

The first die 110 may include input/output (I/O) features over the interconnect structure of the first die 110, as an example. For example, the first die 110 may comprise a plurality of first contact pads 112 that may function as I/O features of the first die 110. The first contact pads 112 may include, or may consist of, a conductive material such as aluminum, copper, or the like. The first contact pads 112 may be electrically connected to the one or more active devices of the first die 110 through the various conductive features in the interconnect structure of the first die 110.

In the example shown in FIG. 1A and FIG. 1B, the first die 110 includes a first bonding structure 114 at the front side of the first die 110. The first bonding structure 114 includes a first dielectric layer 114*d* and first conductive pads 114*p* embedded in the first dielectric layer 114*d*. The first conductive pads 114*p* are landed on the first contact pads 112 and electrically coupled to the active devices of the first die 110 through the first contact pads 112. In some embodiments, the first dielectric layer 114*d* may comprise $SiO_2$, and the first conductive pads 114*p* may comprise Cu. Alternatively, the first dielectric layer 114*d* and the first conductive pads 114*p* may comprise other materials. In the example shown in FIG. 1A and FIG. 1B, surfaces of the first conductive pads 114*p* and the first dielectric layer 114*d* facing away from the first die 110 are substantially coplanar such that a first surface 114*s* of the first bonding structure 114 facing away from the first die 110 is a flat surface.

Similar to the first die 110, the second die 120 may include a substrate, one or more active devices, and an interconnect structure. The substrate, one or more active devices, and interconnect structure of the second die 120 are not shown in FIG. 1A for the sake of simplicity. The substrate, one or more active devices, and interconnect structure of the second die 120 may be similar to that of the first die 110 as described above.

Similar to the first die 110, the second die 120 may also comprise a plurality of second contact pads 122 that may function as I/O features of the second die 120. The second contact pads 122 may include, or may consist of, a conductive material such as aluminum, copper, or the like. The second contact pads 122 may be electrically connected to the one or more active devices of the second die 120 through the various conductive features in the interconnect structure of the second die 120.

In the example shown in FIG. 1A and FIG. 1B, the second die 120 includes a second bonding structure 124 at the front side of the second die 120. The second bonding structure 124 includes a second dielectric layer 124*d* and second conductive pads 124*p* embedded in the second dielectric layer 124*d*. The second conductive pads 124*p* are landed on the second contact pads 122 and electrically coupled to the active devices of the second die 120 through the second contact pads 122. In some embodiments, the second dielectric layer 124*d* may comprise $SiO_2$, and the second conductive pads 124*p* may comprise Cu. Alternatively, the second dielectric layer 124*d* and the second conductive pads 124*p* may comprise other materials. In the example shown in FIG. 1A and FIG. 1B, surfaces of the second conductive pads 124*p* and the second dielectric layer 124*d* facing away from the second die 120 are substantially coplanar such that a second surface 124*s* of the second bonding structure 124 facing away from the second die 120 is a flat surface.

The interconnection die 130 functions to provide electrical communication between two or more dies bonded thereon. In some embodiments, the interconnection die 130 is a silicon bridge. In some embodiments, the interconnection die 130 includes one or more redistribution layers (RDLs) and a plurality of connectors connected to the one or more RDLs. The redistribution layers may include metal lines formed of a metal such as copper, aluminum, tungsten, or titanium distributed in a plurality of layers, and vias interconnecting the metal lines of different layers. The RDLs and the connectors are not shown in FIG. 1A for the sake of simplicity.

The interconnection die 130 may be free from active devices (such as transistors) and passive devices (such as inductors, resistors, and capacitors) in accordance with some embodiments. In alternative embodiments, interconnection die 130 includes passive devices, but does not include active devices. In yet alternative embodiments, interconnection die 130 includes both active devices and passive devices therein. Interconnection die 130 does not include through substrate vias or through silicon vias therein, in some embodiments.

The interconnection die 130 may include a third bonding structure 132 at the front side of the interconnection die 130. The third bonding structure 132 includes a third dielectric layer 132*d* and third conductive pads 132*p* embedded in the third dielectric layer 132*d*. The third conductive pads 132*p* may be landed on the connectors and electrically coupled to the RDLs of the interconnection die 130 through the connectors. In some other embodiments, the third conductive pads 132*p* may be the connectors of the interconnection die 130. In some embodiments, the third dielectric layer 132*d* may comprise $SiO_2$, and the third conductive pads 132*p* may comprise Cu. Alternatively, the third dielectric layer 132*d* and the third conductive pads 132*p* may comprise other materials. In the example shown in FIG. 1A, surfaces of the third conductive pads 132*p* and the third dielectric layer 132*d* facing away from the interconnection die 130 are substantially coplanar such that a third surface 132*s* of the third bonding structure 132 facing away from the third die 130 is a flat surface.

In the example shown in FIG. 1A, the third bonding structure 132 is in contact with the first bonding structure 114 and the second bonding structure 124, such that the first surface 114*s* of the first bonding structure 114 is in contact with the third bonding structure 132, and the second surface 124*s* of the second bonding structure 124 in contact with the third bonding structure 132. In another aspect, a portion of the third surface 132*s* is directly attached to the first surface 114*s*, and another portion of the third surface 132*s* is directly attached to the second surface 124*s*. As shown in FIG. 1A, a shortest distance between the first die 110 and the interconnection die 130 is zero, and a shortest distance between the second die 120 and the interconnection die 130 is zero. In other words, the interface between the first die 110 and the interconnection die 130 and the interface between the second die 120 and the interconnection die 130 are "solder-less", where solders may not be required for the connection.

Referring to FIG. 1A and FIG. 1B. In some embodiments, the third dielectric layer 132*d* is in contact with the first dielectric layer 114*d* and the second dielectric layer 124*d*. A first portion of the third conductive pads 132*p*1 may be in contact with the first conductive pads 114*p*, and a second portion of the third conductive pads 132*p*2 may be in contact with the second conductive pads 124*p*, such that the RDLs of the interconnection die 130 may provide electrical communication between the first die 110 and the second die 120 and provide fan-out regions. In this way, the first die 110 and the second die 120 are connected through the interconnection die 130, such that signals form the first die or the second die 120 may be communicated between the first die 110 and the second die 120 through the interconnection die 130. In some embodiments, the first die 110 and the second die 120 may be connected through the interconnection die without being connected to additional redistribution wiring and without solder. As such, the processing rate of the semiconductor structure may be further improved, and the heat consumption may be reduced.

The semiconductor structure 100 may include a first insulating encapsulant 140 laterally encapsulating the first die 110 and the second die 120. The first insulating encapsulant 140 may include non-organic materials such as silicon oxide, silicon oxynitride, and the like. In some other embodiments, the first insulating encapsulant 140 may include materials such as an epoxy resin, a molding underfill, and the like. In the example shown in FIG. 1A, a thickness T1 of the first insulating encapsulant 140 may be substantially equal to a height of the first die 110 and the second die 120, and the first surface 114*s* of the first bonding structure 114, the second surface 124*s* of the second bonding structure 124, and a top surface 140*t* of the first insulating encapsulant 140 facing the interconnection die 130 are substantially coplanar. Therefore, the first surface 114*s*, the second surface 124*s*, and the top surface 140*t* may provide a flat plane to facilitate the bonding of the interconnection die 130 to the first die 110 and the second die 120.

The semiconductor structure 100 may include a second insulating encapsulant 150 laterally encapsulating the interconnection die 130. The second insulating encapsulant 150 may include any suitable material such as an epoxy resin, a molding underfill, and the like. In some embodiments, the second insulating encapsulant 150 may include silicon oxide, silicon oxynitride, and the like. The second insulating encapsulant 150 is in contact with the first insulating encapsulant 140. As shown in FIG. 1A, the interconnection die 130 is in contact with the first insulating encapsulant 140 and the second insulating encapsulant 150, and the first die 110 is in contact with the first insulating encapsulant 140 and the second insulating encapsulant 150, and the second die 120 is in contact with the first insulating encapsulant 140 and the second insulating encapsulant 150. A thickness T2 of the second insulating encapsulant 150 may be substantially equal to a height of the interconnection die 130.

The semiconductor structure 100 may further include a plurality of through vias 162 penetrating through the second insulating encapsulant 150. Through vias 162 may comprise copper, aluminum, tungsten, nickel, or alloys thereof. The top-view shapes of through vias 162 may be rectangles, squares, circles, or the like. At least one of the through vias 162 may be in contact with a first conductive pad 114*p* of the first bonding structure 114, and at least one of the through vias 162 may be in contact with a second conductive pad 124*p* of the second bonding structure 124. In the example shown in FIG. 1A, the heights of the through vias 162 may be substantially equal to the thickness T2 of the second insulating encapsulant 150.

The semiconductor structure 100 may further include redistribution circuit layers 164 disposed over the first die 110, the second die 120, and the interconnection die 130. The redistribution circuit layers 164 may be disposed at the side of the second insulating encapsulant 150 facing away from the first die 110 and the second die 120. Redistribution circuit layers 164 may extend laterally past edges of the first die 110 and the second die 120 over the second insulating encapsulant 150. Redistribution circuit layers 164 may include metallization wirings 164*w* and one or more inter-layer dielectric layers 164*d*. Interlayer dielectric layers 164*d* may be include any suitable material (e.g., polyimide (PI), polybenzoxazole (PBO), benzocyclobuten (BCB), epoxy, silicone, acrylates, nano-filled phenol resin, siloxane, a fluorinated polymer, polynorbornene. Metallization wirings 164*w* (e.g., conductive lines and/or vias) may be formed in interlayer dielectric layers 164*d*. Metallization wirings 164*w* may include copper or a copper alloy, although other metals such as aluminum, gold, and the like may also be included. The metallization wirings 164*w* may be directly in contact with the through vias 162, such that the first die 110 and the second die 120 may be electrically coupled to the redistribution circuit layers 164 through the through vias 162. The first die 110 and the second die 120 may be connected to a power source or be grounded via the redistribution circuit layers 164 and the through vias 162. In the example shown in FIG. 1A, the front side (the active surface) of the first die

110 and the second die 120 faces the redistribution circuit layers 164 and the interconnection die 130, and the interconnection die 130 is disposed between the redistribution circuit layers 164 and the first die 110 and the second die 120.

The semiconductor structure 100 may include additional package features, such as a plurality of external connectors 166 that may be disposed at a top surface of the redistribution circuit layers 164 facing away from the first die 110 and the second die 120. The external connectors 166 may be a ball grid array (BGA), controlled collapse chip connector (C4) bumps, or the like. The external connectors 166 may be electrically connected to the first die 110 and the second die 120 by way of the redistribution circuit layers 164. The external connectors 166 may be used to electrically connect the semiconductor structure 100 to other package components such as another device die, interposers, package substrates, printed circuit boards, a mother board, or the like.

Figure 1C:
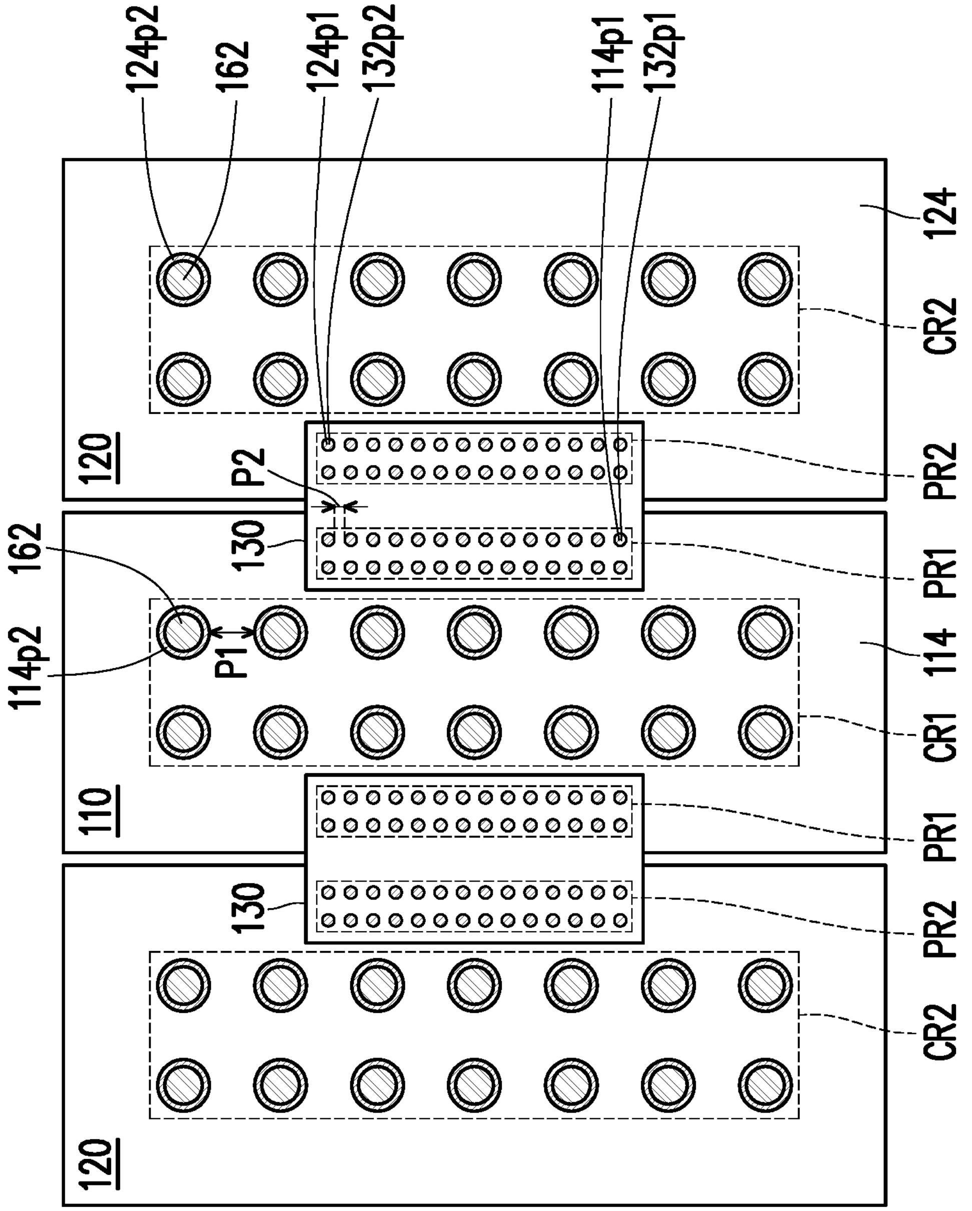
FIG. 1C schematically shows a perspective top view of the semiconductor structure shown in FIG. 1A, in accordance with an embodiment.

FIG. 1C shows a top view of the semiconductor structure 100 shown in FIG. 1A and FIG. 1B in accordance with an embodiment. In FIG. 1C, the interconnection die 130, the first bonding structure 114, the second bonding structure 124, the first conductive pads 114*p*, the second conductive pads 124*p*, and the through vias 162 are shown in perspective view. Other elements are not shown in FIG. 1C for clarity.

Referring to FIG. 1B and FIG. 1C. The first bonding structure 114 may include a first periphery region PR1 and a first central region CR1, wherein a shortest distance between the first periphery region PR1 and the second die 120 is shorter than a shortest distance between the first central region CR1 and the second die 120. In other words, the first periphery region PR1 may be closer to an adjacent second die 120 than the first central region CR1. For example, in FIG. 1C, as to the first periphery region PR1 at the right side of the first die 110 and the first central region CR1, the first periphery region PR1 at the right side is closer to the second die 120 in the right than the first central region CR1.

As shown in FIG. 1B and FIG. 1C, an arrangement pitch P1 of the first conductive pads 114*p*1 in the first periphery region PR1 may be finer than an arrangement pitch P2 of the first conductive pads 114*p*2 in the first central region CR1, and a minimum size of the first conductive pads 114*p*1 in the first periphery region PR1 is smaller than a minimum size of the first conductive pads 114*p*2 in the first central region CR1. In other words, the first conductive pads 114*p*1 in the first periphery region PR1 may be more closely arranged and may have smaller critical diameter.

Similarly, the second bonding structure 124 may include a second periphery region PR2 and a second central region CR2, wherein a shortest distance between the second periphery region PR2 and the first die 110 is shorter than a shortest distance between the second central region CR2 and the first die 110. In other words, the second periphery region PR2 may be closer to an adjacent first die 110 than the second central region CR2. For example, in FIG. 1C, as to the second periphery region PR2 and the second central region CR2 of the second die 120 in the right, the second periphery region PR2 is closer to the first die 110 than the second central region CR2.

As shown in FIG. 1B and FIG. 1C, similar to the first die 110, an arrangement pitch of the second conductive pads 124*p*1 in the second periphery region PR2 is finer than an arrangement pitch of the second conductive pads 124*p*2 in the second central region CR2, and a minimum size of the second conductive pads 124*p*1 in the second periphery region PR2 is smaller than a minimum size of the second conductive pads 124*p*2 in the second central region CR2. In other words, the second conductive pads 124*p*1 in the second periphery region PR2 may be more closely arranged and may have smaller critical diameter.

Specifically, the third bonding structure 132 is in contact with the first bonding structure 114 in the first periphery region PR1 and in contact with the second bonding structure 124 in the second periphery region PR2, such that the first conductive pads 114*p*1 in the first periphery region PR1 is in contact with the first portion of the third conductive pads 132*p*1, and the second conductive pads 124*p*1 in the second periphery region PR2 is in contact with second portion of the third conductive pads 132*p*2 to facilitate the electrical communication between the first die 110 and the second die 120. Moreover, as shown in FIG. 1B and FIG. 1C, the through vias 162 are in contact with the first conductive pads 114*p*2 in the first central region CR1, and the through vias 162 are in contact with the second conductive pads 124*p*2 in the second central region CR2.

FIGS. 2A through 2F schematically show cross-sectional views of various intermediary stages of manufacturing a semiconductor structure 100 shown in FIG. 1A, in accordance with an embodiment.

Figure 2A:
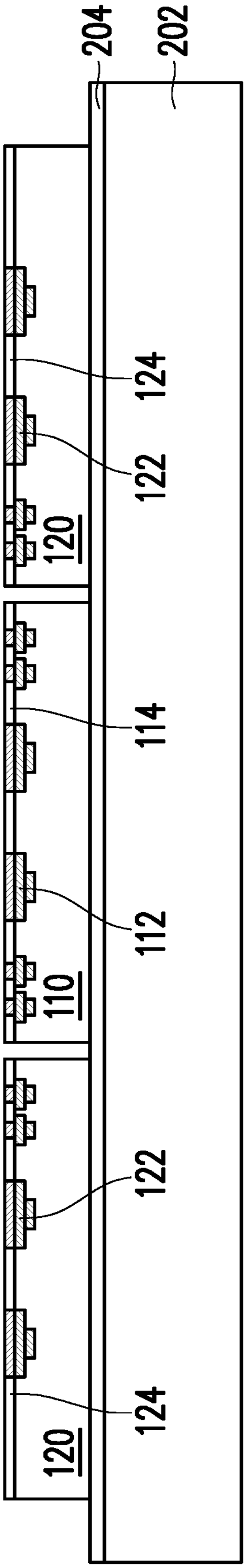
FIGS. 2A through 2F schematically show cross-sectional views of various intermediary stages of manufacturing a semiconductor structure shown in FIG. 1A, in accordance with an embodiment.

FIG. 2A shows a carrier 202, which may provide temporary mechanical and structural support to the features of the semiconductor structure 100 that are formed during subsequent processing steps. The carrier 202 may comprise, for example, glass, silicon, silicon oxide, aluminum oxide, or the like. In some embodiments, the carrier 202 may be a carrier wafer, and a plurality of semiconductor structures 100 may be formed over the carrier 202.

In FIG. 2A, a bonding film 204 is formed over the carrier 202. In some embodiments, the bonding film 204 includes silicon oxide, or another suitable oxide material. The first die 110 and the second die 120 may then be provided (e.g. using a pick and place process) on the bonding film 204 and over the carrier 202. FIG. 2A shows a first die 110 and two second dies 120, however, the numbers of the first die 110 and the second die 120 are not limited by the disclosure. The first die 110 and a second die 120 may have characteristics and structures as stated above. For example, the first die 110 may have a first bonding structure 114, and the second die 120 may have a second bonding structure 124. As illustrated in the example of FIG. 2A, the front sides of the first die 110 and the second die 120 may face away from the carrier 202, while the back sides of the first die 110 and the second die 120 may face the carrier 202 and may be in contact (e.g. physical contact) with the bonding film 204.

In some embodiments, the first die 110 and the second die 120 are bonded to the bonding film 204 on the carrier 202 at the back side (the non-active surface). In some embodiments, the first die 110 and the second die 120 are bonded to the bonding film 204 by, for example, fusion bonding, or other bonding process. A fusion bonding process creates an oxide-to-oxide bond or substrate-to-substrate bond through a cleaning and/or surface activation process followed by applying pressure, heat and/or other bonding process steps to the joined surfaces. The fusion bonding may provide a more level arrangement between the first die 110 and the second die 120 to facilitate the upcoming bonding of the interconnection die 130 to the first die 110 and the second die 120. In some other embodiments, first die 110 and the second die 120 may be attached to the carrier 202 using die attachment film (DAF), an adhesive, or the like.

Figure 2B:
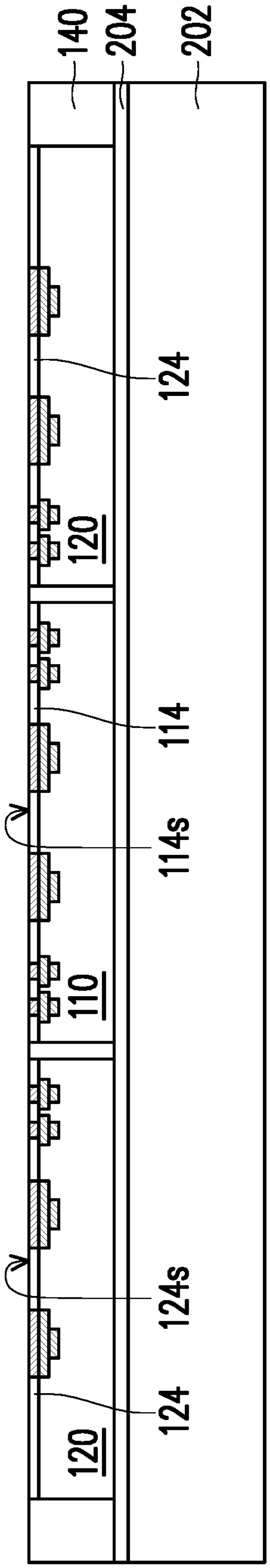

In FIG. 2B, a gap filling process is performed with a first encapsulating material to fill the gaps between the first die 110 and the second die 120 and laterally encapsulate the first die 110 and the second die 120 to form the first insulating encapsulant 140. After the filling process, the first die 110 and the second die 120 may be buried in the first insulating encapsulant 140. The first encapsulating material may include silicon oxide or the like, such that a more planar surface can be formed for the bonding between the interconnection die 130 and the first die 110 and the second die 120. Methods for forming the first insulating encapsulant 140 may include any suitable deposition process, such as, atomic layer deposition (ALD), chemical vapor deposition (CVD), high density plasma CVD (HDP-CVD), physical vapor deposition (PVD), and the like.

In the example shown in FIG. 2B, a planarization process, such as a grinding process (e.g., a chemical-mechanical polish (CMP) or mechanical grinding) or etch back, may be performed on the first insulating encapsulant 140 to expose the first bonding structure 114 and the second bonding structure 124. In other words, the first encapsulating material may be partially removed to reveal the first bonding structure 114 and the second bonding structure 124. In a top down view of the first die 110 and the second die 120, the first insulating encapsulant 140 may encircle the first die 110 and the second die 120.

Figure 2C:
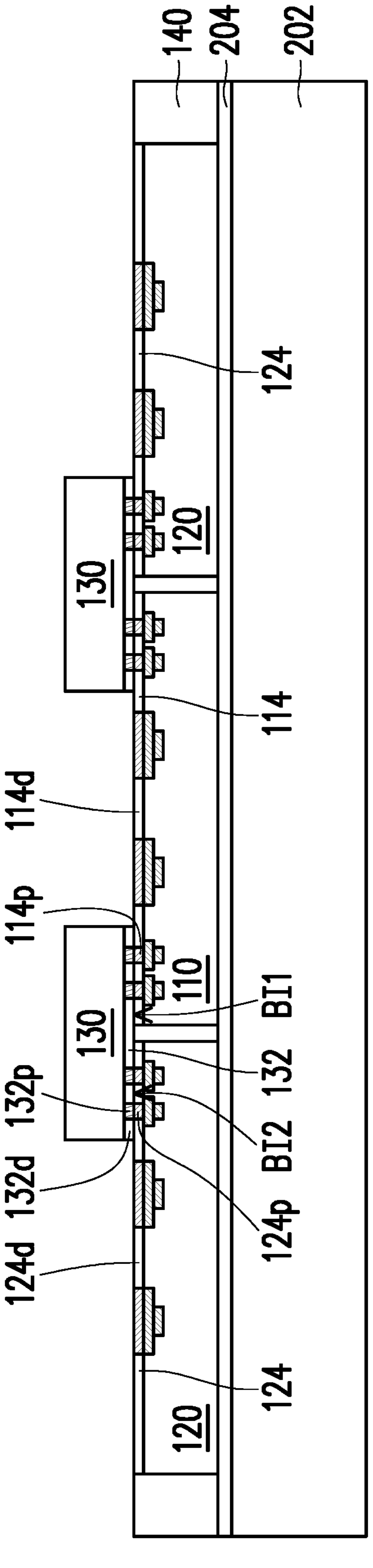

In FIG. 2C, an interconnection die 130 may be stacked over the first die 110 and the second die 120. The interconnection die 130 may have characteristics and structures as stated above. For example, the interconnection die 130 may have a third bonding structure 132. The interconnection die 130 may be placed (e.g. using a pick and place process) on the first die 110 and the second die 120, such that a portion of the third conductive pads 132*p* are substantially aligned with a portion of the first conductive pads 114*p*, and a portion of the third conductive pads 132*p* are substantially aligned with a portion of the second conductive pads 124*p*.

The interconnection die 130 may then be bonded to the first die 110 and the second die 120 by a bonding process. The bonding process may create an oxide-to-oxide bond or substrate-to-substrate bond through a cleaning and/or surface activation process followed by applying pressure, heat and/or other bonding process steps to the joined surfaces. The bonding process may also create metal-to-metal bond that is achieved by fusing the conductive elements. After the bonding process, a first bonding interface BI1 may be formed between the third bonding structure 132 and the first bonding structure 114, and a second bonding interface BI2 may be formed between the third bonding structure 132 and the second bonding structure 124. The first bonding interface BI1 may include a dielectric-to-dielectric bonding interface, which is formed between the first dielectric layer 114*d* and the third dielectric layer 132*d*, and a metal-to-metal bonding interface, which is formed between the first conductive pads 114*p* and the third conductive pads 132*p*. A second bonding interface BI2 may include a dielectric-to-dielectric bonding interface, which is formed between the third dielectric layer 132*d* and the second dielectric layer 124*d*, and a metal-to-metal bonding interface, which is formed between the second conductive pads 124*p* and the third conductive pads 132*p*.

Figure 2D:
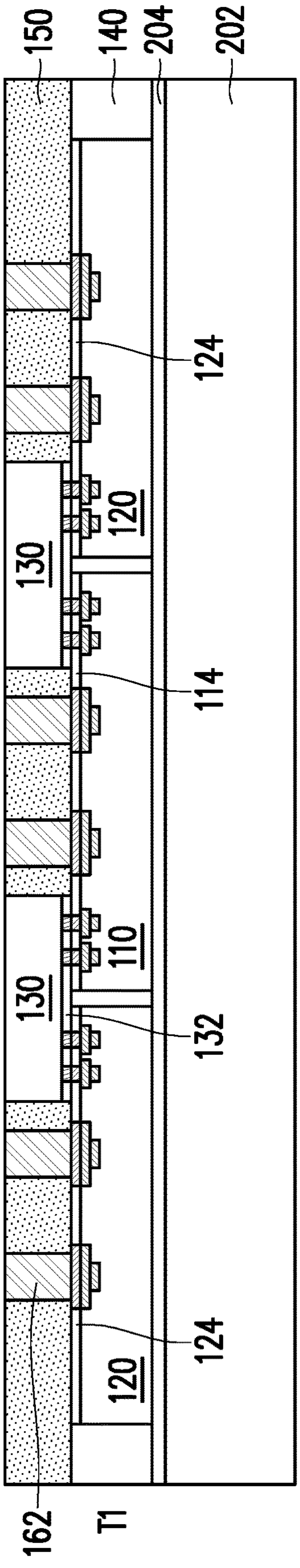
Figure 2E:
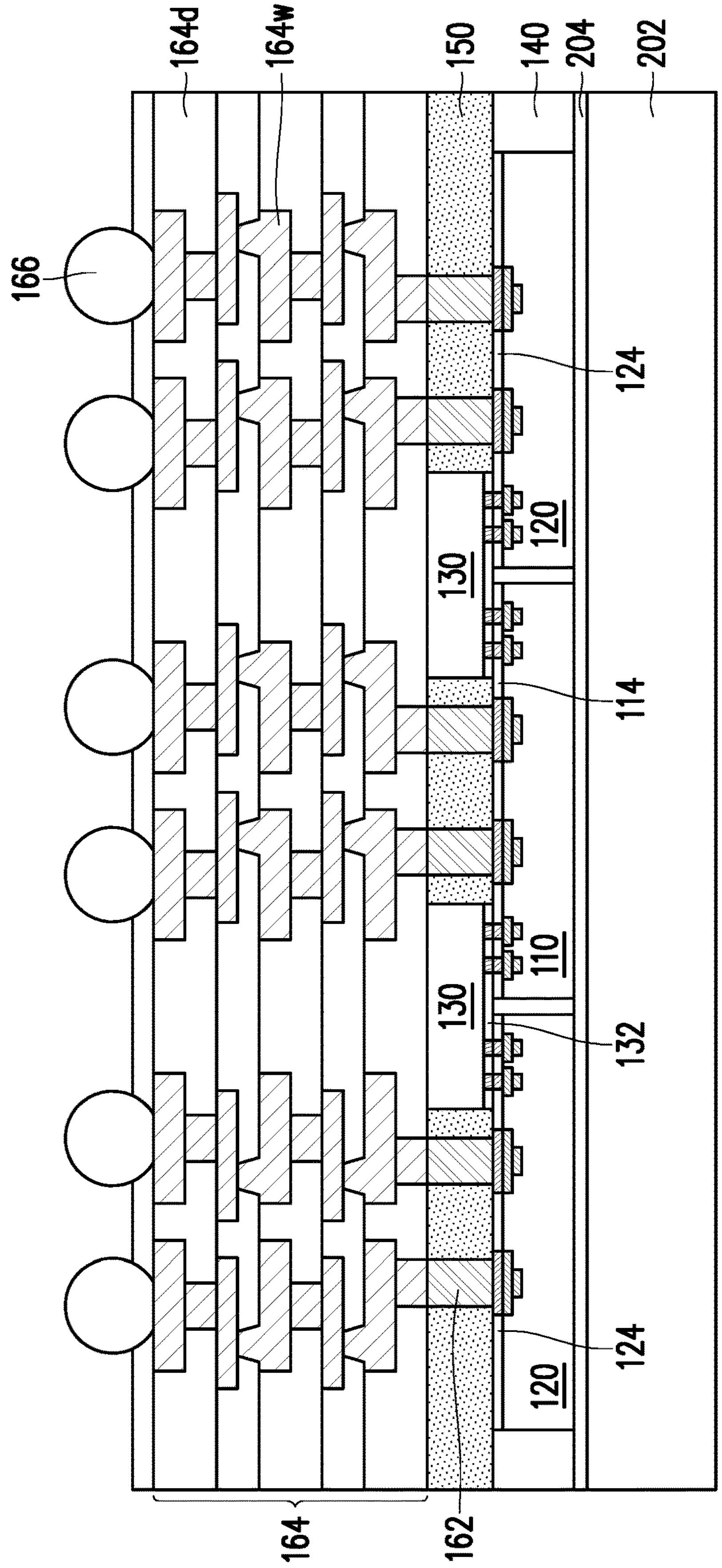
Figure 2F:
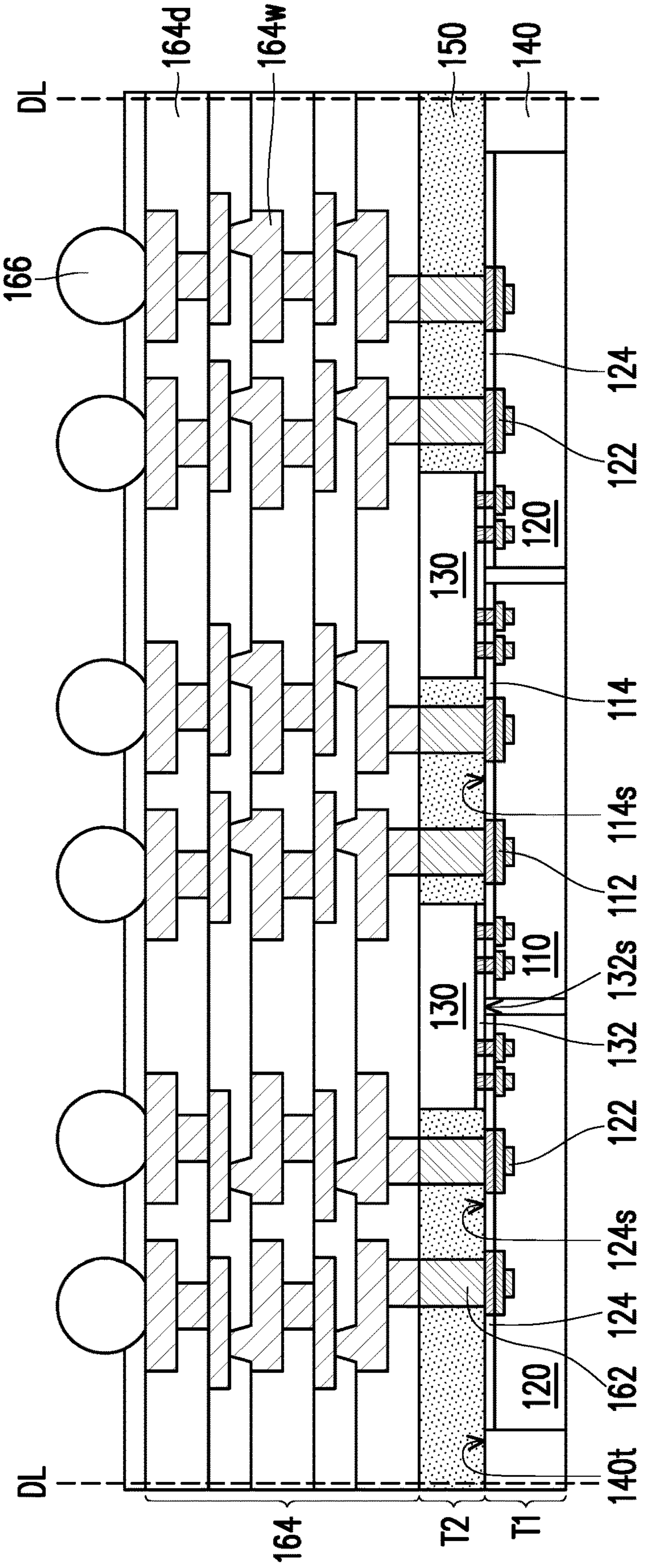
Figure 2G:
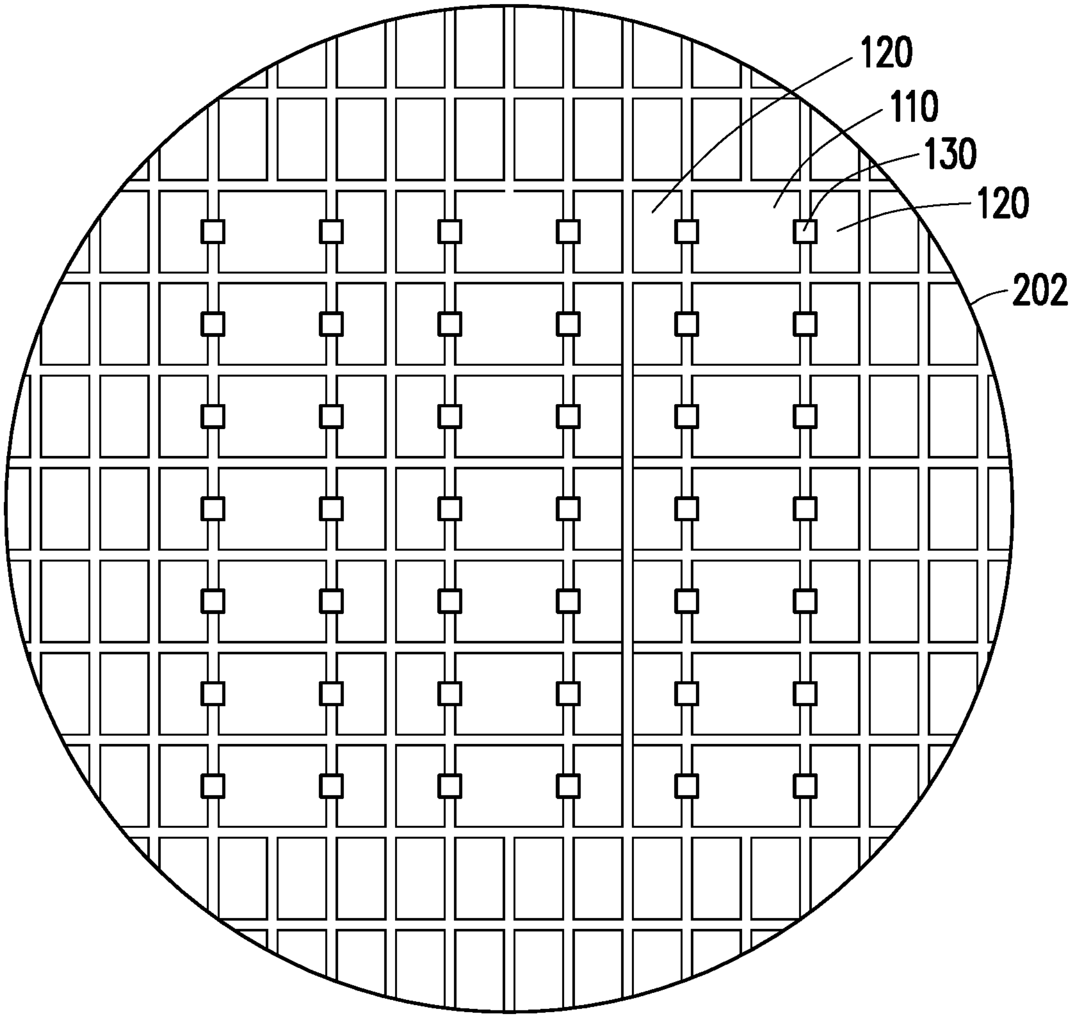
FIG. 2G shows a top view of the semiconductor structure shown in FIG. 2C, according to an embodiment.

FIG. 2G shows a top view of the first die 110, the second die 120, and the interconnection die 130 on a carrier 202 as a carrier wafer, according to an embodiment.

Figure 2H:
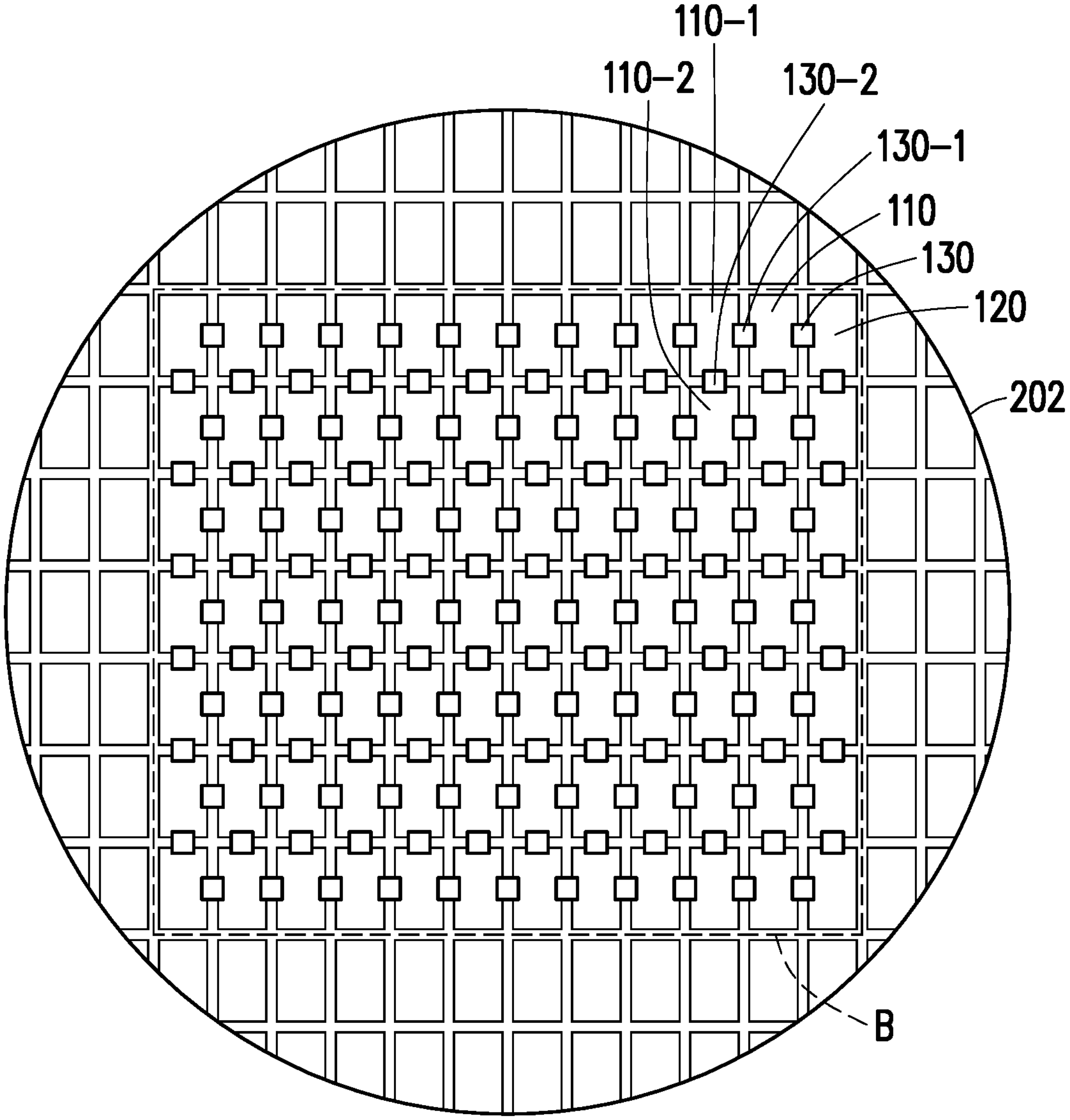
FIG. 2H shows a top view of the semiconductor structure shown in FIG. 2C, according to an embodiment.

FIG. 2H shows a top view of the first die 110, the second die 120, and the interconnection die 130 on a carrier 202 as a carrier wafer, according to another embodiment. As shown in FIG. 2H, the first die 110 may be connected to another die (e.g., die 110-1) through another interconnection die (e.g., interconnection die 130-1) in substantially the same manner as the first die 110 being connected the second die 120, and the die 110-1 may be further connected to yet another die (e.g., die 110-2) through another interconnection die (e.g., interconnection die 130-2) in substantially the same manner. As such, a plurality of dies may be connected with each other to form a single package. In the example shown in FIG. 2H, dies in the region B over the carrier 202 may be connected with each other to form a single package. In the package formed from FIG. 2H, a die may be connected to more than one die, for example, the first die 110 may be connected to both the second die 120 and die 110-1.

Figure 2I:
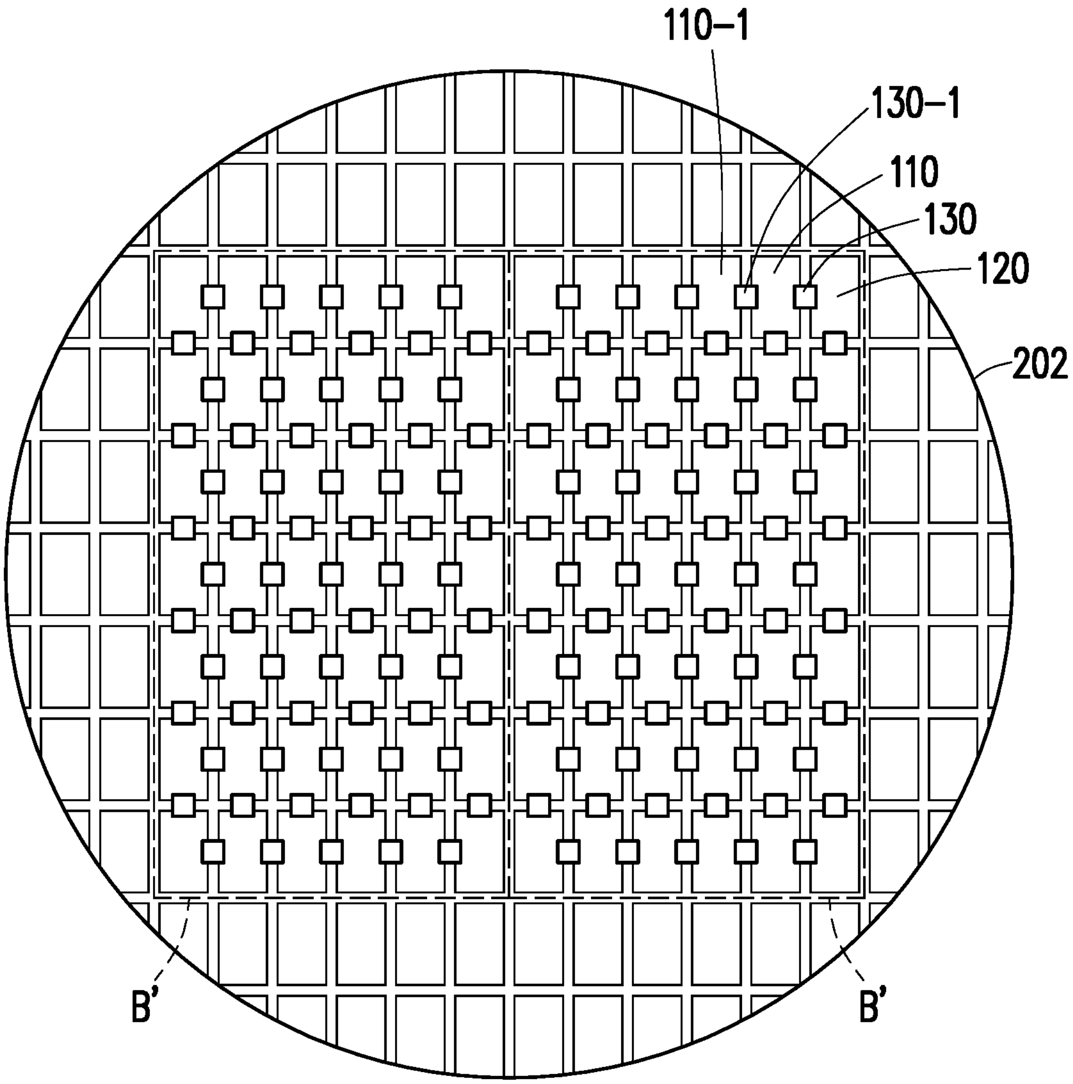
FIG. 2I shows a top view of the semiconductor structure shown in FIG. 2C, according to an embodiment.

FIG. 2I shows a top view of the first die 110, the second die 120, and the interconnection die 130 on a carrier 202 as a carrier wafer, according to another embodiment. The embodiment shown in FIG. 2I is similar to the embodiment shown in FIG. 2H, except that the carrier 202 (wafer) may be divided into multiple region B', wherein dies in the region B' over the carrier 202 may be connected with each other to form a single package. Therefore, more than one package may be formed over the carrier 202.

In FIG. 2D, through vias 162 are formed over the first bonding structure 114 and the second bonding structure 124. A photo resist (not shown) may be applied over the first bonding structure 114 and the second bonding structure 124, and is then patterned. As a result, openings are formed in the photo resist. The through vias 162 may then be formed in the openings through plating, which may be electro plating or electro-less plating. After the plating of the through vias 162, the photo resist is removed. The through vias 162 may be formed with heights greater than, equal to, or smaller than the thickness of the interconnection dies 130 in various embodiments. In some embodiments, the through vias 162 may be formed with heights greater than the interconnection dies 130.

In FIG. 2D, a second encapsulating material laterally encapsulates the interconnection dies 130 and the through vias 162 to form the second insulating encapsulant 150. The second encapsulating material may be a molding compound, epoxy, or the like, and may be applied by compression molding, transfer molding, or the like. After curing, the second insulating encapsulant 150 is formed and may undergo a grinding process to expose the through vias 162. Top surfaces of the through vias 162 and the second insulating encapsulant 150 are coplanar after the grinding process.

In FIG. 2E, a redistribution circuit layer 164 is formed over the first die 110 and the second die 120. The redistribution circuit layer 164 may be formed over the second insulating encapsulant 150 and the through vias 162. As an example, the redistribution circuit layer 164 may include metallization wirings 164*w* (e.g. conductive lines and/or vias) formed in one or more interlayer dielectric layers 164*d*. The one or more interlayer dielectric layers 164*d* of the redistribution circuit layer 164 may be formed of any suitable insulating and/or polymer material (e.g. PI, PBO, BCB, epoxy, silicone, acrylates, nano-filled phenol resin, siloxane, a fluorinated polymer, polynorbornene, or the like) using any suitable method, such as, spin-on coating, sputtering, or the like. The formation of the metallization wirings 164*w* in the one or more interlayer dielectric layers 164*d* may include patterning the one or more interlayer dielectric layers 164*d* (e.g. using a combination of photolithography and etching processes) and forming the metallization wirings 164*w* in the patterned one or more interlayer dielectric layers 164*d* (e.g. by a damascene and/or dual damascene process). The metallization wirings 164*w* of the redistribution circuit layer 164 may be coupled (e.g. electrically and/or physically coupled) to the through vias 162. Consequently, the redistribution circuit layer 164 may be formed electrically coupled to the first die 110 and the second die 120 through the through vias 162.

In FIG. 2E, some of the metallization wirings 164*w* of the redistribution circuit layer 164 may be exposed (e.g. by a laser opening process and/or etching process), and the external connectors 166 may thereafter be formed over the exposed metallization wirings 164*w* of the redistribution circuit layer 164 (e.g. by a BGA mounting process).

In FIG. 2F, a thinning process may be performed on the carrier 202 to thin down or substantially remove the carrier 202. As a result of the thinning process, the back sides of the first die 110 and the second die 120 may be exposed. The first insulating encapsulant 140 may also be exposed. However, in some other embodiments, at least a portion of the carrier 202 is remained after the thinning process. In some other embodiments, the thinning process may be omitted. The thinning process may be performed using a wet etching process and/or a planarization process, such as a mechanical grinding process or a CMP process. Following this, the structure shown in FIG. 2F may be singulated or diced (e.g. along dicing line DL), thereby forming a plurality of packages, each of which may be substantially identical to the semiconductor structure 100 shown in FIG. 1A.

Figure 3:
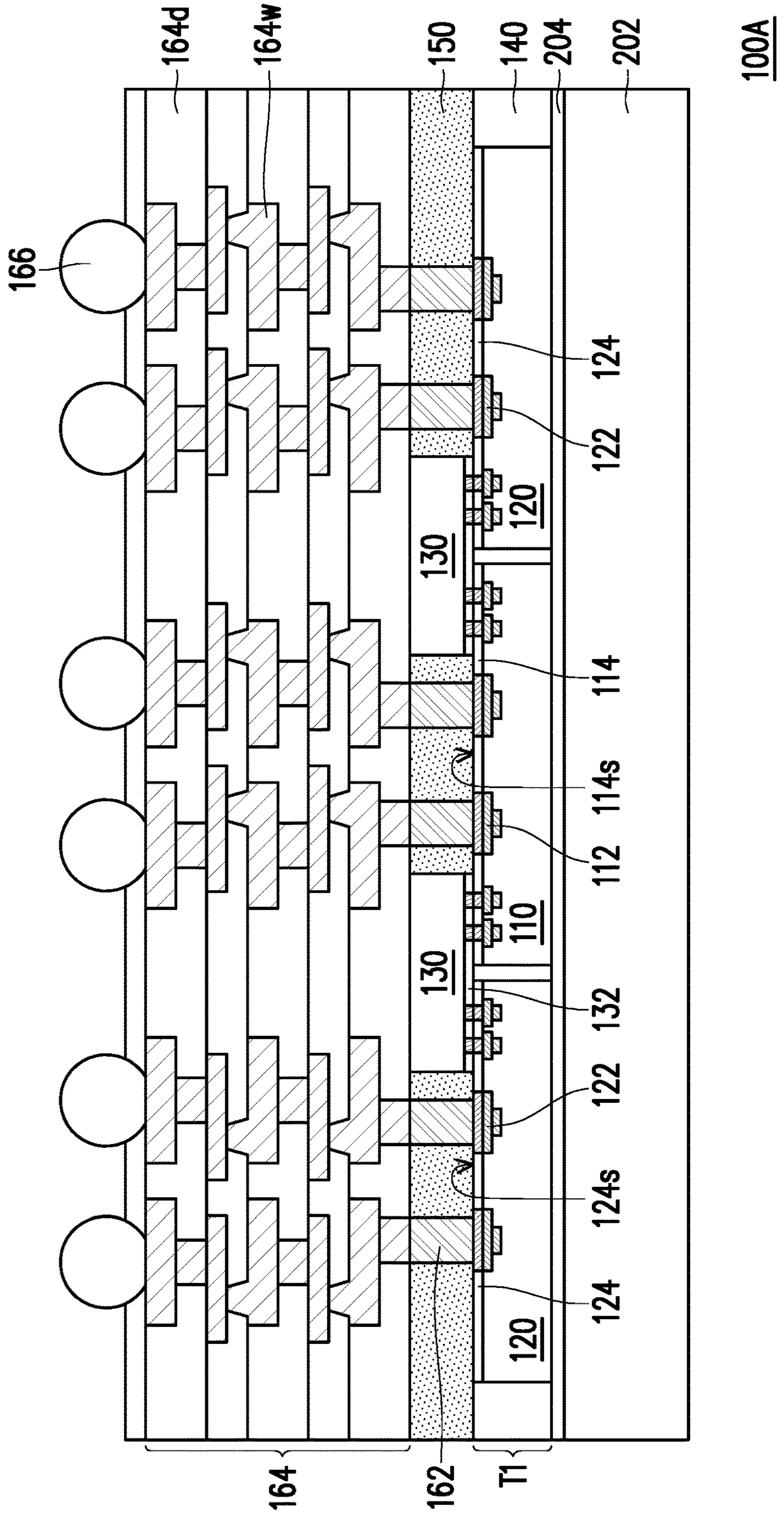
FIG. 3 schematically shows a semiconductor structure, in accordance with an embodiment.

FIG. 3 shows a semiconductor structure 100A in accordance with an embodiment. As shown in FIG. 3, similar elements have a same reference number as shown in FIG. 1A. The semiconductor structure 100A illustrated in FIG. 3 is similar to the semiconductor structure 100 illustrated in FIG. 1A except that in the embodiment, a carrier 202 is disposed below the first die 110 and the second die 120, such that the first die 110 and the second die 120 is disposed between the second insulating encapsulant 150 and the carrier 202. The carrier 202 may provide desired rigidity for the semiconductor structure 100A and may facilitate heat dissipation.

The semiconductor structure 100A may be formed through a process similar to the process shown in FIG. 2A to FIG. 2F, except that at least a portion of the carrier 202 is remained after the thinning process. In some embodiments, the thinning process may be omitted.

Figure 4:
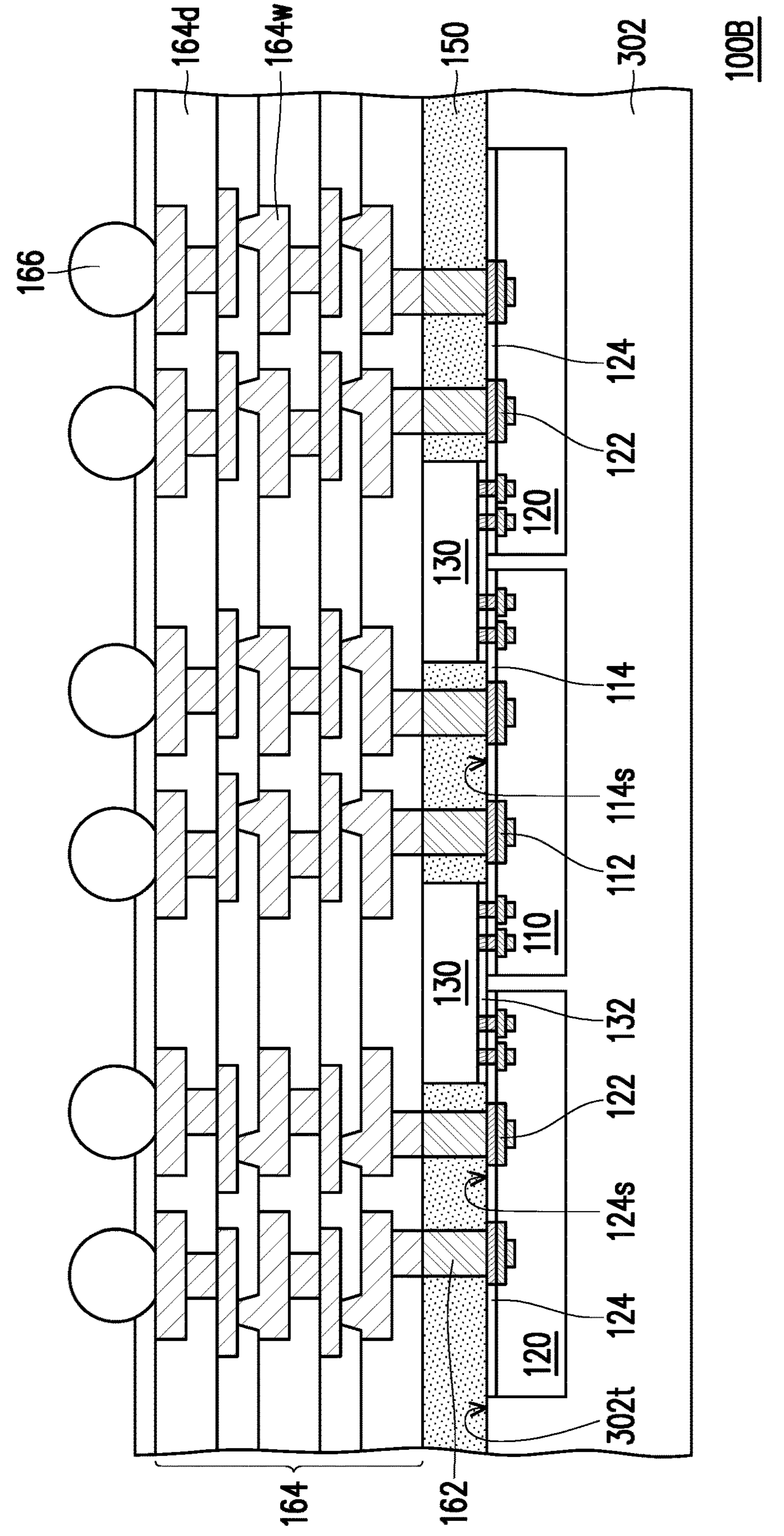
FIG. 4 schematically shows a semiconductor structure, in accordance with an embodiment.

FIG. 4 schematically shows a semiconductor structure 100B, in accordance with an embodiment. As shown in FIG. 4, similar elements have a same reference number as shown in FIG. 1A. The semiconductor structure 100B illustrated in FIG. 4 is similar to the semiconductor structure 100 illustrated in FIG. 1A except that in the embodiment, the first die 110 and the second die 120 are die reticles in a wafer 302. In other words, the first die 110 and the second die 120 may be die reticles remaining in wafer form prior to a singulation process. The first die 110 may include a first bonding structure 114 at the front side of the first die 110, and the second die 120 may include a second bonding structure 124 at the front side of the second die 120.

Referring to FIG. 4, the first surface 114*s* of the first bonding structure 114 facing the interconnection die 130, the second surface 124*s* of the second bonding structure 124 facing the interconnection die 130, and a top surface 302*t* of the wafer 302 facing the interconnection die 130 are substantially coplanar. The interconnection die 130 is in contact with both the wafer 302 and the second insulating encapsulant 150. As an example, the first die 110 and the second die 120 may be the same kind of die, and more than two dies may be connected by a plurality of the interconnection dies 130.

FIGS. 5A through 5D schematically show cross-sectional views of various intermediary stages of manufacturing a semiconductor structure shown in FIG. 4, in accordance with an embodiment.

Figure 5A:
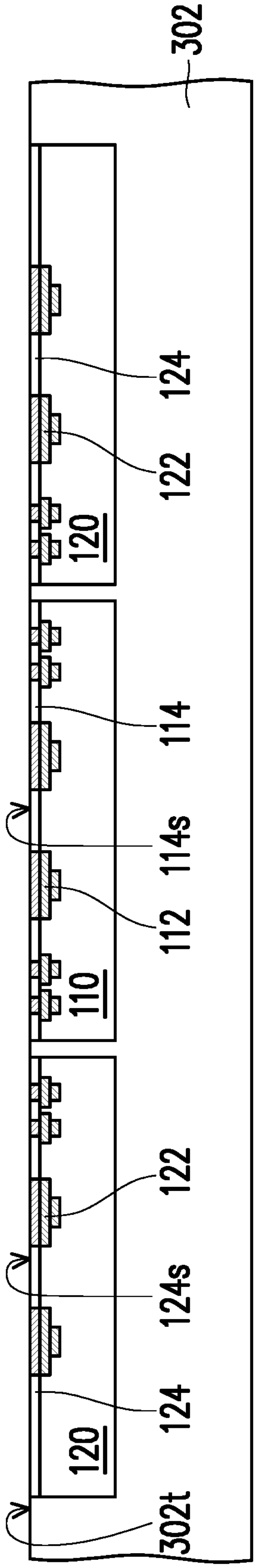
FIGS. 5A through 5D schematically show cross-sectional views of various intermediary stages of manufacturing a semiconductor structure shown in FIG. 4, in accordance with an embodiment.

FIG. 5A shows a wafer 302. The wafer 302 may, as an example, be a carrier wafer, and a plurality of semiconductor structure 100B may be formed on the wafer 302. In FIG. 5A, a first die 110 and a second die 120 may be formed in the wafer 302 as die reticles. The first die 110 and a second die 120 may have characteristics and structures as stated above. For example, a first bonding structure 114 may be formed at the front side of the first die 110, and a second bonding structure 124 may be formed at the front side of the second die 120. As illustrated in the example of FIG. 5A, the first bonding structure 114 and the second bonding structure 124 are formed at the top surface 302*t* of the wafer 302, such that the first surface 114*s* of the first bonding structure 114, the second surface 124*s* of the second bonding structure 124, and a top surface 302*t* of the wafer 302 are substantially coplanar.

Figure 5B:
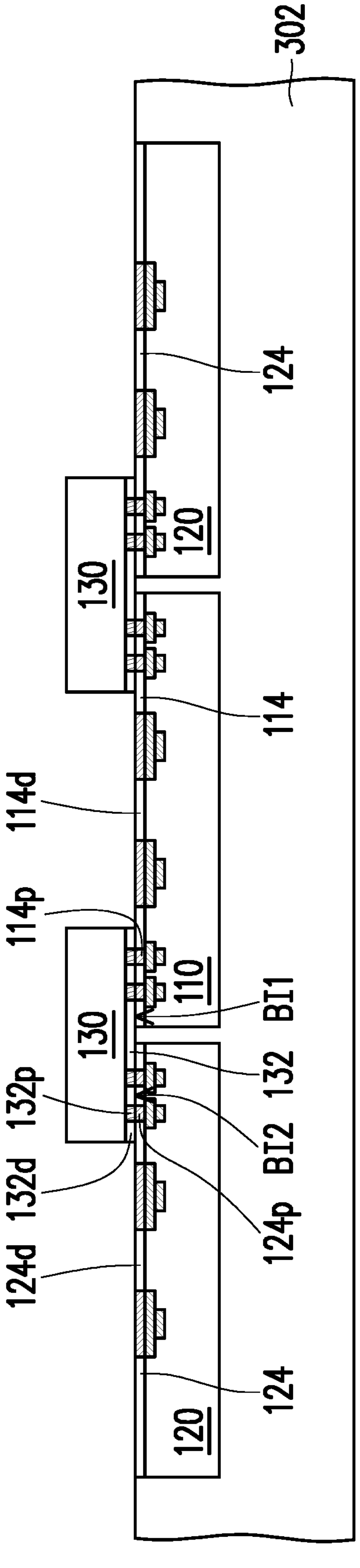

In FIG. 5B, an interconnection die 130 may be placed (e.g. using a pick and place process) on the top surface 302*t* of the wafer 302, such that the interconnection die 130 may be stacked over the first die 110 and the second die 120. The interconnection die 130 may have characteristics and structures as stated above. For example, the interconnection die 130 may have a third bonding structure 132. The interconnection die 130 may be placed on the first die 110 and the second die 120, such that a portion of the third conductive pads 132*p* are substantially aligned with a portion of the first conductive pads 114*p*, and a portion of the third conductive pads 132*p* are substantially aligned with a portion of the second conductive pads 124*p*.

The interconnection die 130 may then be bonded to the first die 110 and the second die 120 by a bonding process. The bonding process may create an oxide-to-oxide bond or substrate-to-substrate bond through a cleaning and/or surface activation process followed by applying pressure, heat and/or other bonding process steps to the joined surfaces. The bonding process may also create metal-to-metal bond that is achieved by fusing the conductive elements. After the bonding process, a first bonding interface BI1 may be formed between the third bonding structure 132 and the first bonding structure 114, and a second bonding interface BI2 may be formed between the third bonding structure 132 and the second bonding structure 124. The first bonding interface BI1 may include a dielectric-to-dielectric bonding interface, which is formed between the first dielectric layer 114*d* and the third dielectric layer 132*d*, and a metal-to-metal bonding interface, which is formed between the first conductive pads 114*p* and the third conductive pads 132*p*. A second bonding interface BI2 may include a dielectric-to-dielectric bonding interface, which is formed between the third dielectric layer 132*d* and the second dielectric layer 124*d*, and a metal-to-metal bonding interface, which is formed between the second conductive pads 124*p* and the third conductive pads 132*p*.

Figure 5C:
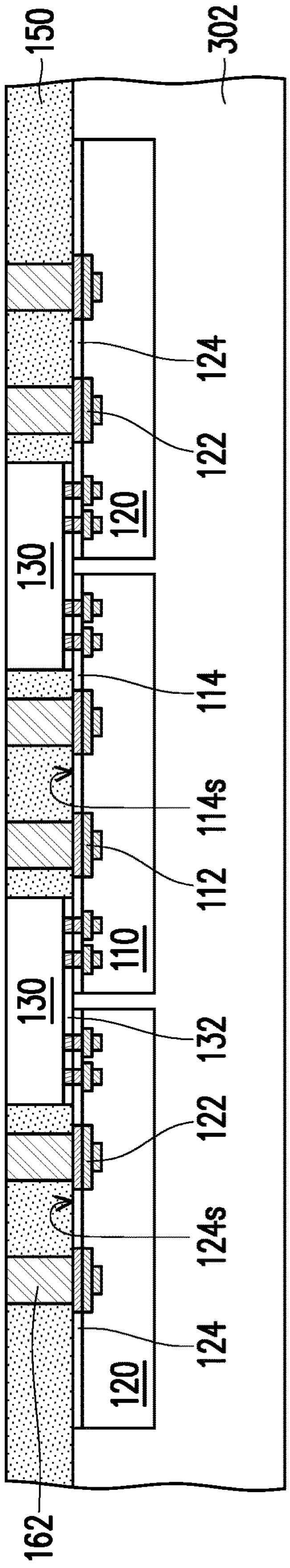

In FIG. 5C, similar to the process in FIG. 2D, through vias 162 are formed over the first bonding structure 114 and the second bonding structure 124. A second encapsulating material laterally may then encapsulate the interconnection dies 130 and the through vias 162 to form the second insulating encapsulant 150. The second encapsulating material may be a molding compound, epoxy, or the like, and may be applied by compression molding, transfer molding, or the like. After curing, the second insulating encapsulant 150 is formed and may undergo a grinding process to expose the through vias

162. Top surfaces of the through vias 162 and the second insulating encapsulant 150 may be coplanar after the grinding process.

Figure 5D:
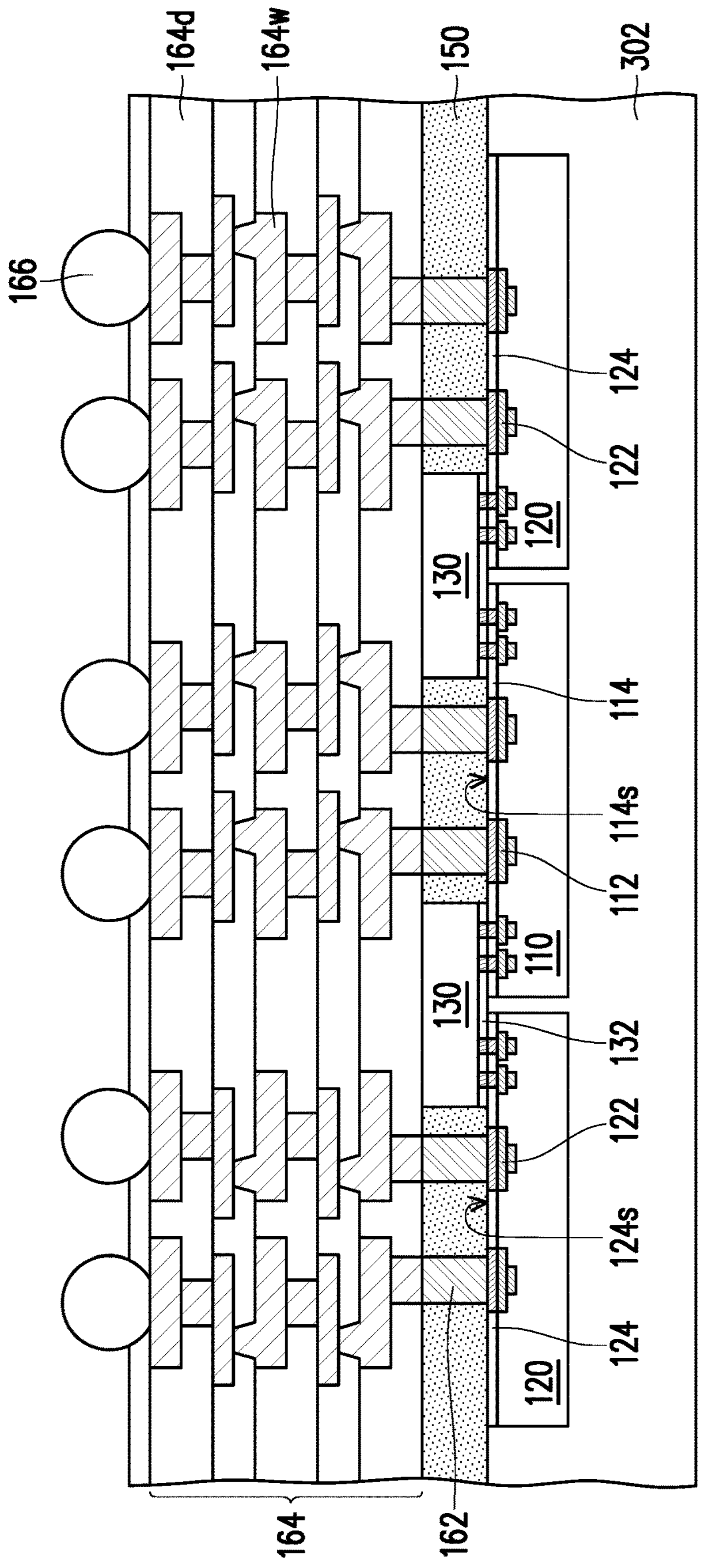

In FIG. 5D, similar to the process in FIG. 2E, a redistribution circuit layer 164 is formed over the first die 110 and the second die 120 and electrically coupled to the first die 110 and the second die 120 through the through vias 162. In FIG. 5D, some of the metallization wirings 164*w* of the redistribution circuit layer 164 may be exposed (e.g. by a laser opening process and/or etching process), and the external connectors 166 may thereafter be formed over the exposed metallization wirings 164*w* of the redistribution circuit layer 164 (e.g. by a BGA mounting process).

A thinning process similar to the thinning process in FIG. 2F may be performed to thin down the wafer 302. In some embodiments, the thinning process may be omitted. The structure shown in FIG. 5D may then be diced into one or a plurality of package, each of which may be substantially identical to the semiconductor structure 100B shown in FIG. 4.

Figure 6:
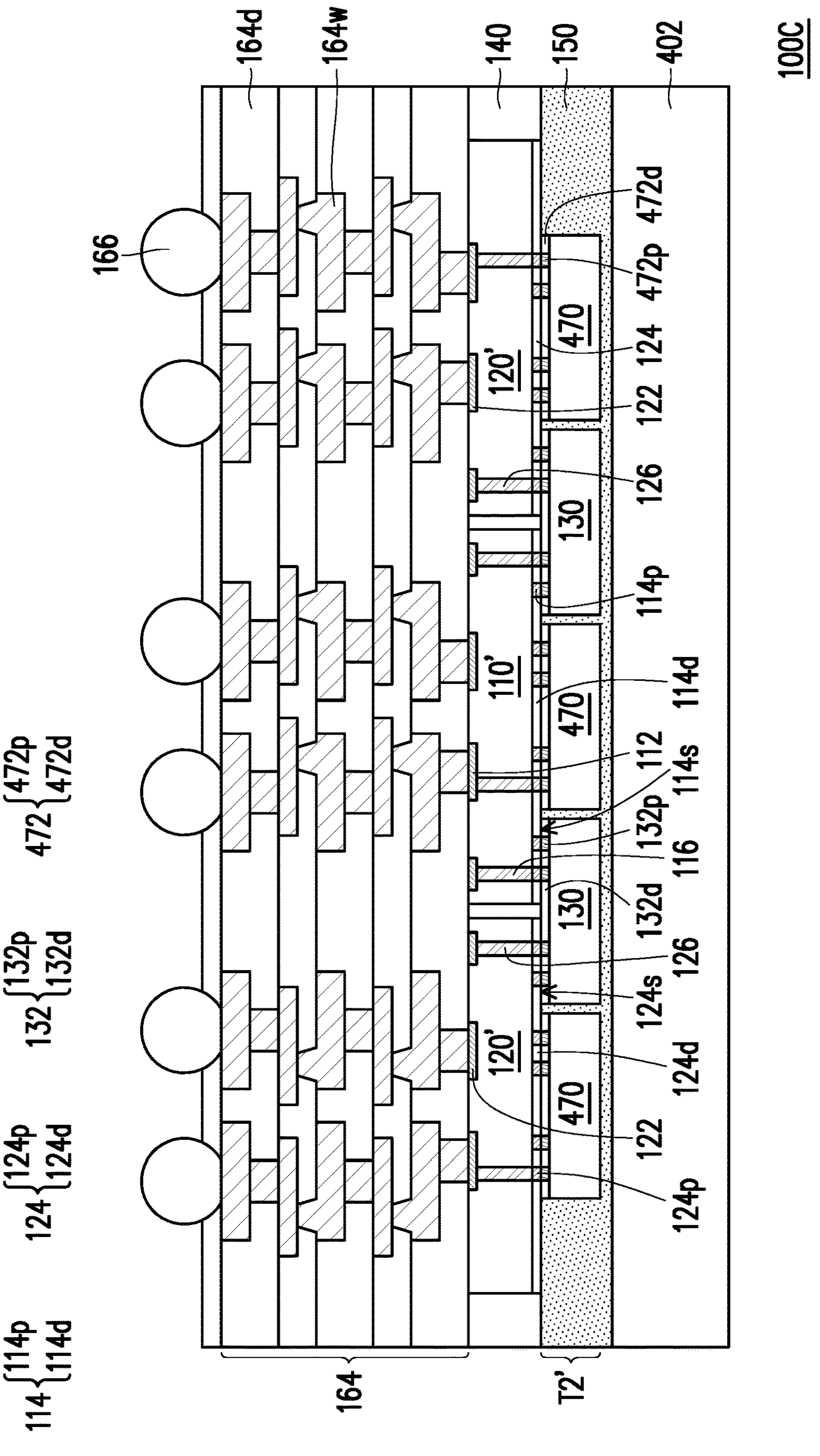
FIG. 6 schematically shows a semiconductor structure, in accordance with an embodiment.

FIG. 6 schematically shows a semiconductor structure 100C, in accordance with an embodiment. As shown in FIG. 6, similar elements have a same reference number as shown in FIG. 1A. The semiconductor structure 100C illustrated in FIG. 6 is similar to the semiconductor structure 100 illustrated in FIG. 1A except that the first die 110' includes a first bonding structure 114 at the back side of the first die 110', and the second die 120' includes a second bonding structure 124 at the back side of the second die 120'. The third bonding structure 132 of the interconnection die 130 is in contact with the first bonding structure 114 and the second bonding structure 124, such that the first surface 114*s* of the first bonding structure 114 on the backside surface of the first die 110' is in contact with the third bonding structure 132, and the second surface 124*s* of the second bonding structure 124 on the backside surface of the second die 120' is in contact with the third bonding structure 132. The first die 110' may further include one or more through-silicon vias (TSV) 116, and the first bonding structure 114 may be electrically coupled to the first contact pads 112 through the TSV 116. The second die 120' may also include one or more through-silicon vias (TSV) 126, and the second bonding structure 124 is electrically coupled to the second contact pads 122 through the TSV 126.

The semiconductor structure 100C may include a substrate 402. The substrate 402 may be similar to the carrier 202 of the semiconductor structure 100. The first die 110' and the second die 120' may be disposed between the redistribution circuit layers 164 and the substrate 402.

The semiconductor structure 100C may further include at least one additional die 470. The additional dies 470 may be similar to the first die 110 and the second die 120 of the semiconductor structure 100. As an example, the first die 110' and the second die 120' may be CPU die, while the additional die 470 may be SRAM die. The additional die 470 may include a fourth bonding structure 472. The fourth bonding structure 472 may include a fourth dielectric layer 472*d* and fourth conductive pads 472*p* embedded in the fourth dielectric layer 472*d*. The fourth bonding structure 472 may be in contact with the first bonding structure 114, such that the first surface 114*s* is in contact with the fourth bonding structure 472, the fourth conductive pads 472*p* are in contact with the first conductive pads 114*p*, and the fourth dielectric layer 472*d* is in contact with the first dielectric layer 114*d*. The fourth bonding structure 472 may be in contact with the second bonding structure 124, such that the second surface 124*s* is in contact with the fourth bonding structure 472, the fourth conductive pads 472*p* are in contact with the second conductive pads 124*p*, and the fourth dielectric layer 472*d* is in contact with the second dielectric layer 124*d*. In other words, the interface between the additional die 470 and the first die 110' and the interface between the additional die 470 and the second die 120' may be "solder-less", and the connection between the additional die 470 and the first die 110' and the connection between the additional die 470 and the second die 120' may be without redistribution wiring. As such, the vertical stack of the additional die 470 on the first die 110' and the second die 120' may further increase the processing rate of the semiconductor structure 100C, and the heat consumption may be reduced.

In the example shown in FIG. 6, the second insulating encapsulant 150 may laterally encapsulate the interconnection dies 130 and additional dies 470. The second insulating encapsulant 150 may include non-organic materials such as silicon oxide, silicon oxynitride, and the like. In some embodiments, a thickness T2' of the second insulating encapsulant 150 may be slightly larger than the height of the interconnection dies 130 and additional dies 470, such that a layer of second insulating encapsulant 150 exist between the substrate 402 and the interconnection dies 130 and additional dies 470. The layer of second insulating encapsulant 150 may facilitate the bonding with the substrate 402.

The redistribution circuit layers 164 of the semiconductor structure 100C may be disposed over the first die 110', the second die 120', and the interconnection die 130, and the first die 110' and the second die 120' may be electrically coupled to the redistribution circuit layers 164 at the front side (the active surface) of the first die 110' and the second die 120', for example, through the first contact pads 112 and the second contact pads 122. In the embodiment shown in FIG. 6, the first die 110' and the second die 120' may be disposed between the interconnection dies 130 and the redistribution circuit layers 164.

FIGS. 7A through 7G schematically show cross-sectional views of various intermediary stages of manufacturing a semiconductor structure shown in FIG. 6, in accordance with an embodiment.

Figure 7A:
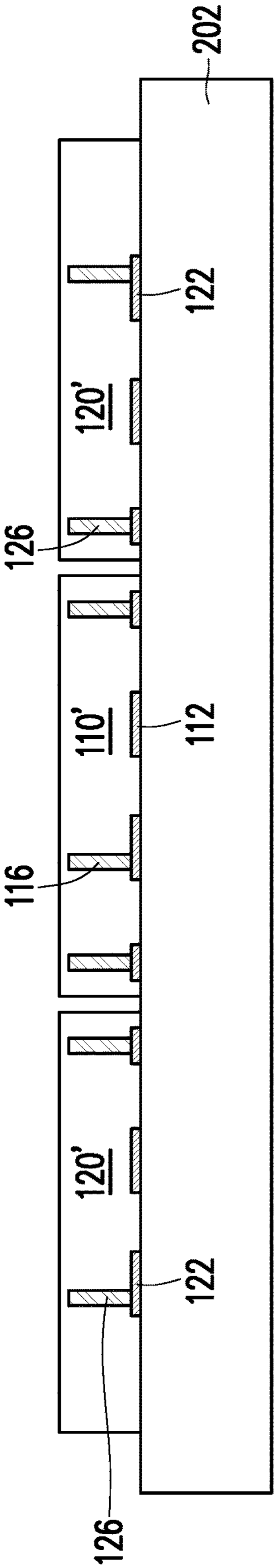
FIGS. 7A through 7G schematically show cross-sectional views of various intermediary stages of manufacturing a semiconductor structure shown in FIG. 6, in accordance with an embodiment.

FIG. 7A shows a carrier 202, which may provide temporary mechanical and structural support to the features of the semiconductor structure 100C that are formed during subsequent processing steps. The carrier 202 may be similar to the carrier 202 in FIG. 2A. The carrier 202 may, as an example, be a carrier wafer.

In FIG. 7A, the first die 110' and the second die 120' may be provided (e.g. using a pick and place process) over the carrier 202. FIG. 7A shows a first die 110' and two second dies 120, however, the numbers of the first die 110' and the second die 120' are not limited by the disclosure. The first die 110' and a second die 120' may have characteristics and structures as stated above. For example, the first die 110' may include TSVs 116, and the second die 120' may include TSVs 126. As illustrated in the example of FIG. 7A, the front sides of the first die 110' and the second die 120' may face the carrier 202 and may be in contact (e.g. physical contact) with the carrier 202, while the back sides of the first die 110' and the second die 120' may face away from the carrier 202. In some embodiments, the first die 110' and the second die 120' are bonded to a bonding film (not shown) on the carrier 202 at the front sides (the active surfaces) through, for example, fusion bonding, or other bonding process. A fusion bonding process creates an oxide-to-oxide bond or substrate-to-substrate bond through a cleaning and/or surface activation process followed by applying pressure, heat and/or other bonding process steps to the joined surfaces. In some other embodiments, the first die 110' and the second die 120' may be attached to the carrier 202 using die attachment film (DAF), an adhesive, or the like.

Figure 7B:
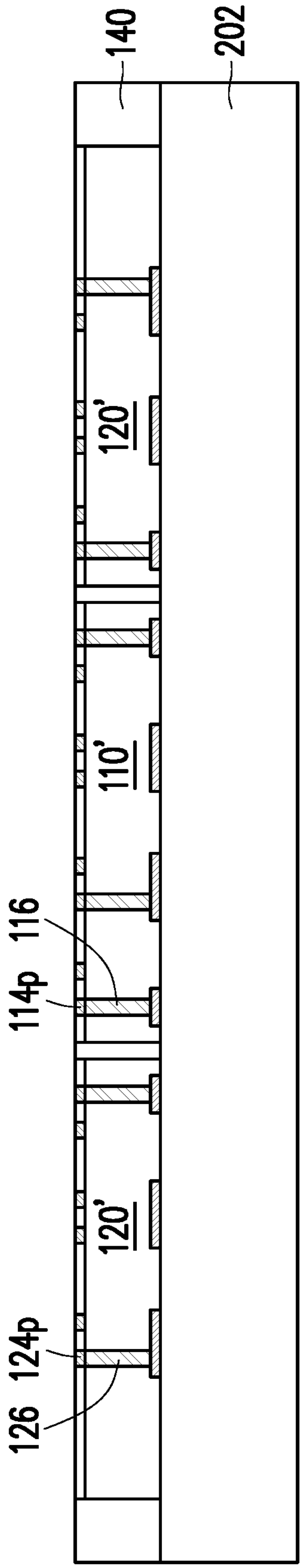

In FIG. 7B, a gap filling process is performed with a first encapsulating material to fill the gaps between the first die 110' and the second die 120' and laterally encapsulate the first die 110' and the second die 120' to form the first insulating encapsulant 140. After the filling process, the first die 110' and the second dies 120 may be buried in the first insulating encapsulant 140. The first encapsulating material may include silicon oxide or the like, such that a more planar surface can be formed for the bonding between the interconnection die 130 and the first die 110' and the second die 120'. Methods for forming the first insulating encapsulant 140 may include any suitable deposition process, such as, atomic layer deposition (ALD), chemical vapor deposition (CVD), high density plasma CVD (HDP-CVD), physical vapor deposition (PVD), and the like.

In FIG. 7B, a planarization process, such as a grinding process (e.g., a chemical-mechanical polish (CMP) or mechanical grinding) may be performed on the first insulating encapsulant 140 and the first die 110' and the second die 120' to expose the TSVs 116 and 126. In some embodiments, after the planarization process, a wet etching operation may be performed to remove a portion of the first die 110' and the second die 120' on the surface, such that a small portion of the TSVs 116 and 126 may protrude from the surface of the first die 110' and the second die 120'. A dielectric material such as silicon nitride (SiN) may be formed on the surface of the first die 110' and the second die 120' through any suitable deposition process, such as, atomic layer deposition (ALD), chemical vapor deposition (CVD), high density plasma CVD (HDP-CVD), physical vapor deposition (PVD), and the like, and the TSVs 116 and 126 may be buried in the dielectric material after the deposition process. A second grinding process (e.g., a chemical-mechanical polish (CMP) or mechanical grinding) may be performed to expose the TSVs 116 and 126. The dielectric material (not shown) surrounding the TSVs 116 and 126 may improve the isolation between the TSVs and reduce the occurrence of leakage.

In FIG. 7B, after the TSVs 116 and 126 are revealed, the first conductive pads 114*p* and the first bonding structure 114 may be formed on the backside surfaces of the first die 110', and the second conductive pads 124*p* and the second bonding structure 124 may be formed on the backside surface of the second die 120'. At least a portion of the first conductive pads 114*p* are electrically coupled to the TSVs 116, and at least a portion of the second conductive pads 124*p* are electrically coupled to the TSVs 126.

Figure 7C:
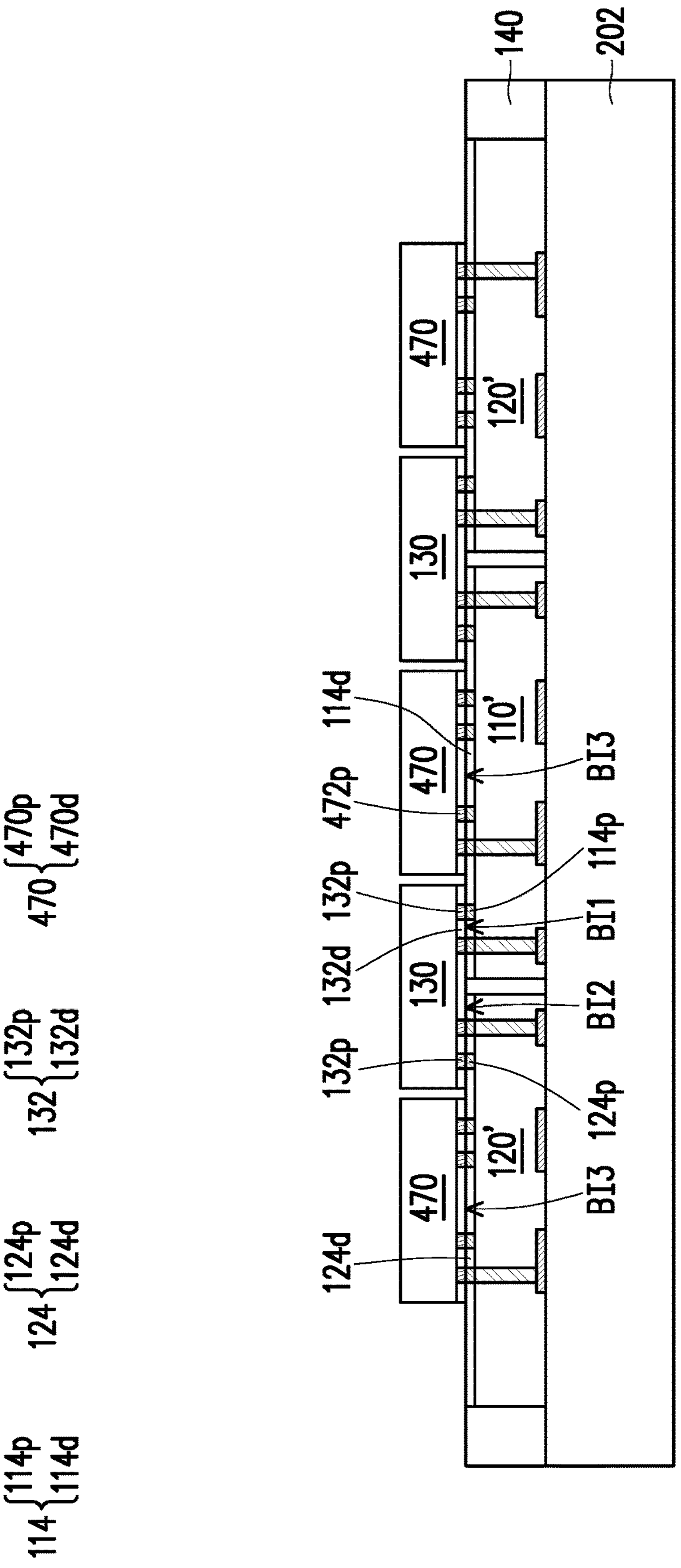

In FIG. 7C, at least one interconnection die 130 may be stacked over and across the first die 110' and the second die 120'. At least one additional die 470 may be stacked over the first die 110' or the second die 120'. The interconnection die 130 and the additional die 470 may have characteristics and structures as stated above. For example, the interconnection die 130 may have a third bonding structure 132, and the additional die 470 may have a fourth bonding structure 472. The interconnection die 130 may be placed (e.g. using a pick and place process) on the first die 110' and the second die 120', such that a portion of the third conductive pads 132*p* are substantially aligned with a portion of the first conductive pads 114*p*, and a portion of the third conductive pads 132*p* are substantially aligned with a portion of the second conductive pads 124*p*. In some embodiments, the additional die 470 may be placed (e.g. using a pick and place process) on the first die 110', such that the fourth conductive pads 472*p* are substantially aligned with a portion of the first conductive pads 114*p*. In some embodiments, the additional die 470 may be placed (e.g. using a pick and place process) on the second die 120', such that the fourth conductive pads 472*p* are substantially aligned with a portion of the second conductive pads 124*p*.

The interconnection die 130 may then be bonded to the first die 110' and the second die 120' by a bonding process. And the additional dies 470 may be bonded to the first die 110' or the second die 120' by the bonding process. The bonding process may be similar to the bonding process described in FIG. 2C. After the bonding process, a first bonding interface BI1 may be formed between the third bonding structure 132 and the first bonding structure 114, and a second bonding interface BI2 may be formed between the third bonding structure 132 and the second bonding structure 124. The first bonding interface BI1 may include a dielectric-to-dielectric bonding interface, which is formed between the first dielectric layer 114*d* and the third dielectric layer 132*d*, and a metal-to-metal bonding interface, which is formed between the first conductive pads 114*p* and the third conductive pads 132*p*. A second bonding interface BI2 may include a dielectric-to-dielectric bonding interface, which is formed between the third dielectric layer 132*d* and the second dielectric layer 124*d*, and a metal-to-metal bonding interface, which is formed between the second conductive pads 124*p* and the third conductive pads 132*p*. Similar to the interconnection die 130, after the bonding process, a third bonding interface BI3 may be formed between the fourth bonding structure 472 and the first bonding structure 114 or between the fourth bonding structure 472 and the second bonding structure 124. The third bonding interface BI3 may include a dielectric-to-dielectric bonding interface, which is formed between the first dielectric layer 114*d* and the fourth dielectric layer 472*d* or between the second dielectric layer 124*d* and the fourth dielectric layer 472*d* and, and a metal-to-metal bonding interface, which is formed between the first conductive pads 114*p* and the fourth conductive pads 472*p* or between the second conductive pads 124*p* and the fourth conductive pads 472*p*.

The first die 110', the second die 120', and the interconnection die 130 may be arranged in various manners similar to the arrangement shown in FIGS. 2G to 2I.

Figure 7D:
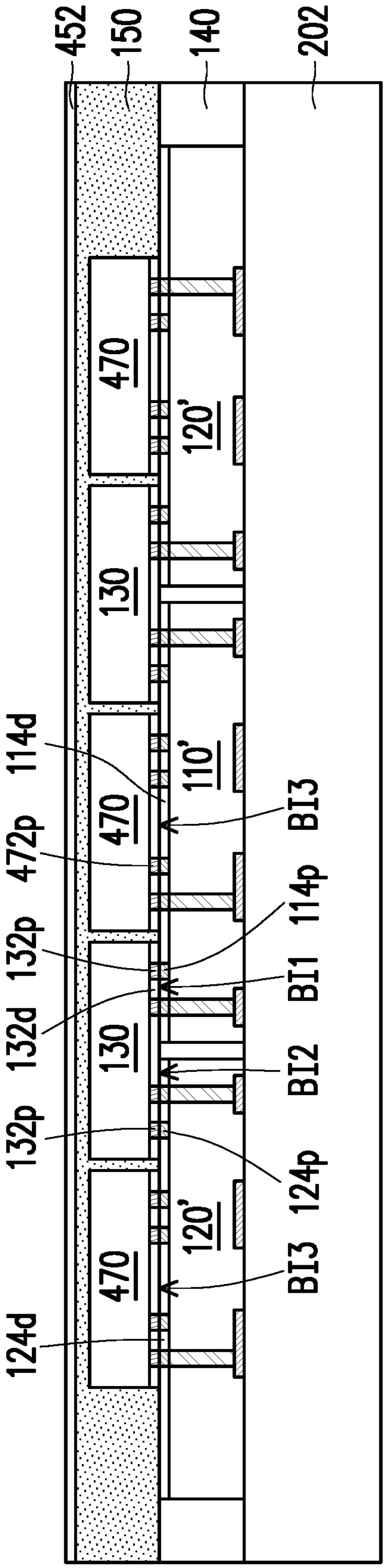

In FIG. 7D, a second filling process is performed with a second encapsulating material to fill the gaps between the interconnection dies 130 and the additional dies 470 and laterally encapsulate the interconnection dies 130 and the additional dies 470 to form the second insulating encapsulant 150. After the filling process, the interconnection dies 130 and the additional dies 470 may be buried in the second insulating encapsulant 150. The second encapsulating material may include silicon oxide or the like for an upcoming bonding of the second insulating encapsulant 150 to a substrate. Methods for forming the second insulating encapsulant 150 may include any suitable deposition process, such as, atomic layer deposition (ALD), chemical vapor deposition (CVD), high density plasma CVD (HDP-CVD), physical vapor deposition (PVD), and the like. A planarization process, such as a grinding process (e.g., a chemical-mechanical polish (CMP) or mechanical grinding), may then be performed on the second insulating encapsulant 150.

A bonding film 452 may be formed over the second insulating encapsulant 150. In some embodiments, the bonding film 452 includes silicon oxide, or another suitable oxide material. Methods for forming the bonding film 452 may include any suitable deposition process, such as, atomic layer deposition (ALD), chemical vapor deposition (CVD), high density plasma CVD (HDP-CVD), physical vapor deposition (PVD), and the like. After the bonding film 452 is formed, a planarization process, such as a grinding process (e.g., a chemical-mechanical polish (CMP) or mechanical grinding), may then be performed on the bonding film 452.

Figure 7E:
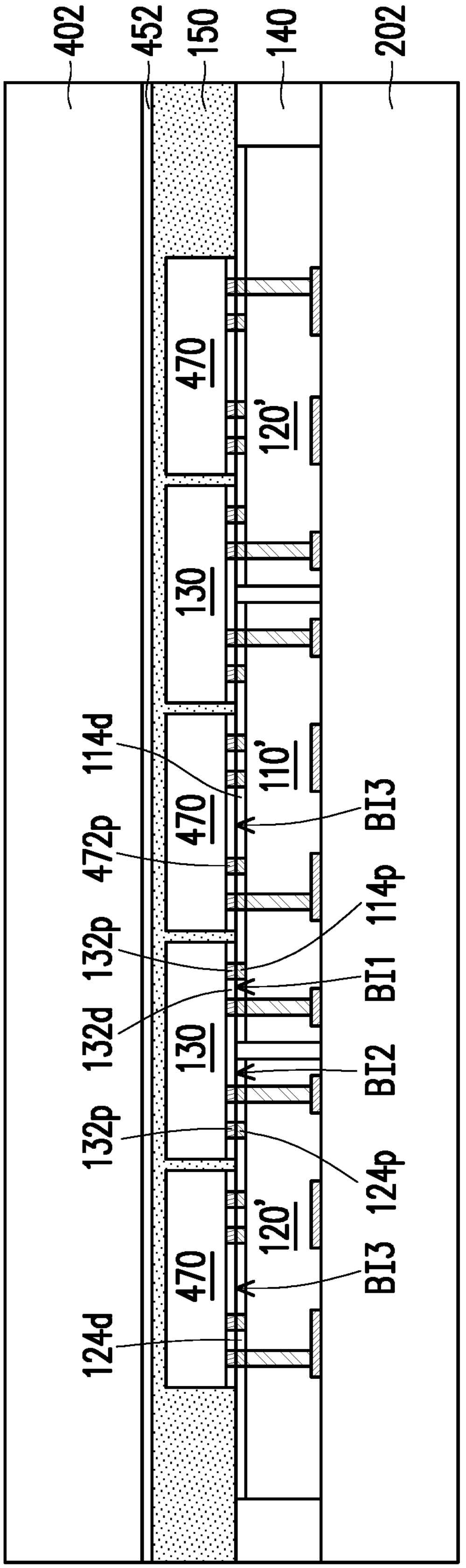

In FIG. 7E, a substrate 402 is bonded to the bonding film 452 by, for example, fusion bonding, or other bonding process. A fusion bonding process creates an oxide-to-oxide bond or substrate-to-substrate bond through a cleaning and/or surface activation process followed by applying pressure, heat and/or other bonding process steps to the joined surfaces.

Figure 7F:
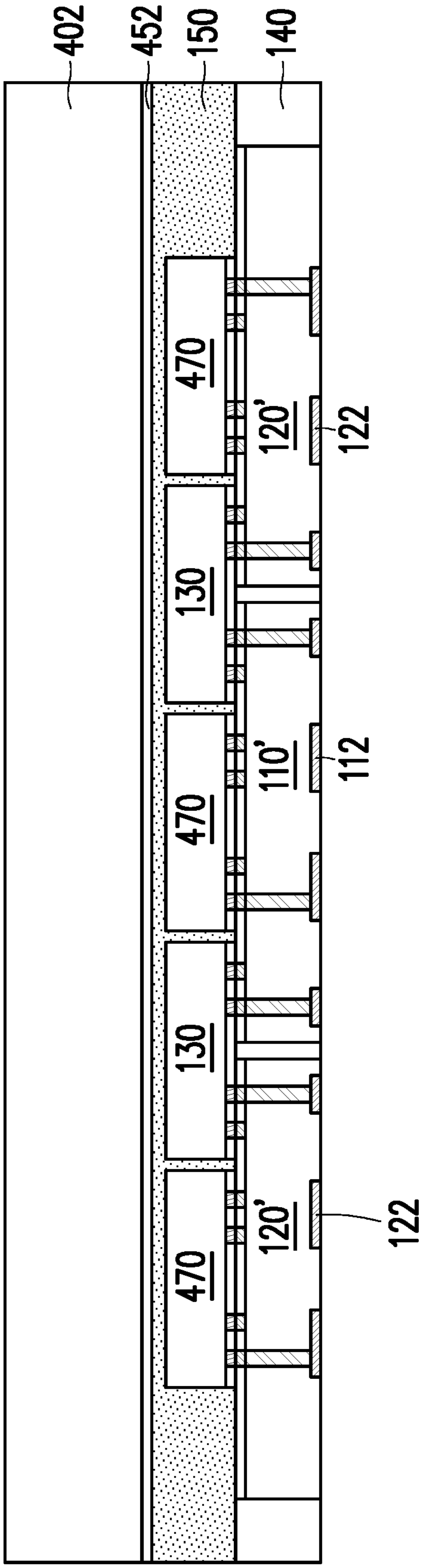

In FIG. 7F, the carrier 202 is removed to reveal the first contact pads 112 and the second contact pads 122. The carrier 202 may be removed through a wet etching process and/or a planarization process, such as a mechanical grinding process or a CMP process.

Figure 7G:
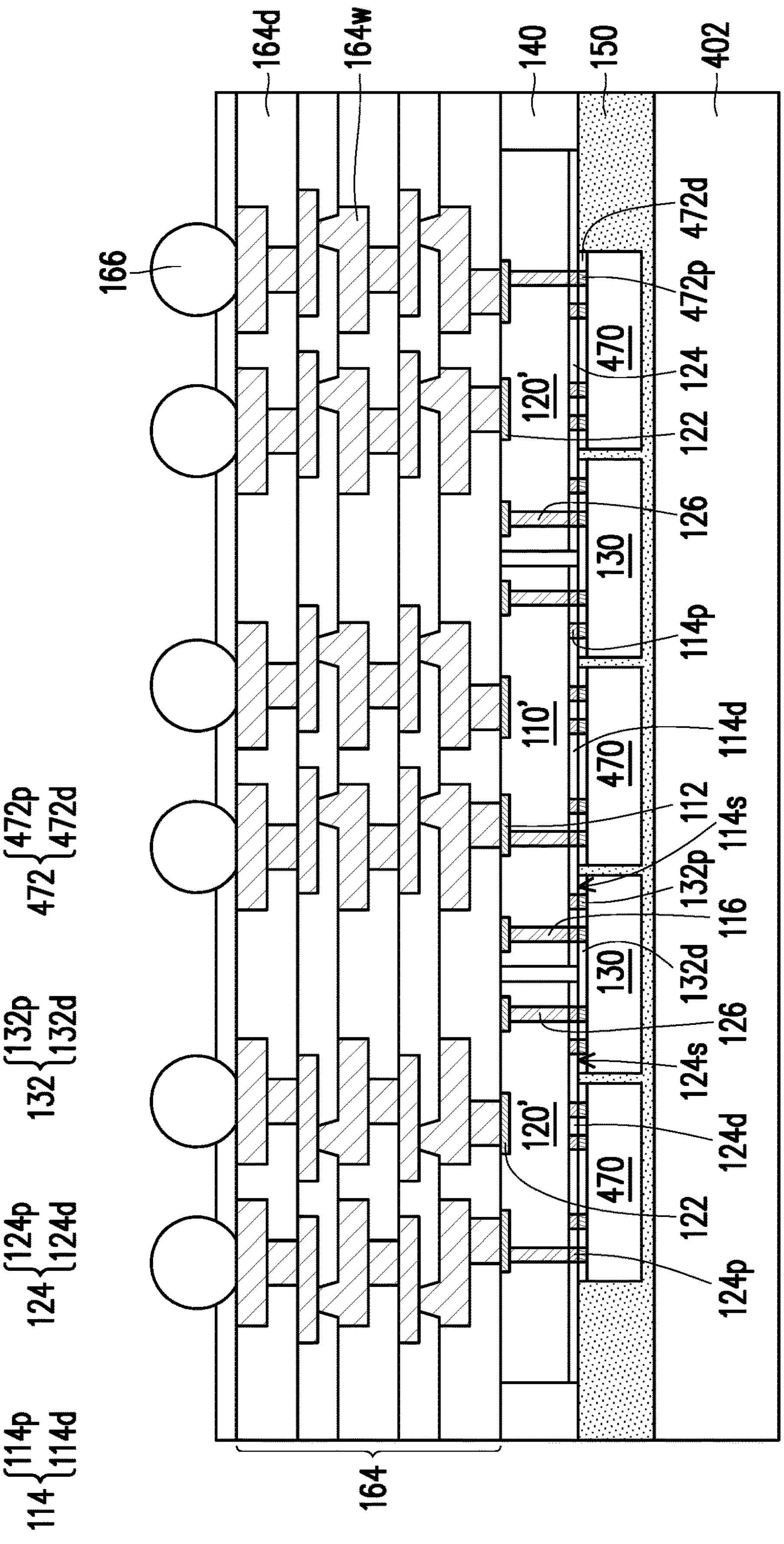

In FIG. 7G, a redistribution circuit layer 164 is formed over the first die 110' and the second die 120'. The redistribution circuit layer 164 may be formed on the first die 110', the second die 120', and the first insulating encapsulant 140. The redistribution circuit layer 164 may have similar structure and be made by similar methods as the redistribution circuit layer 164 shown in FIG. 2E. The metallization wirings 164*w* of the redistribution circuit layer 164 may be coupled (e.g. electrically and/or physically coupled) to the first contact pads 112 and the second contact pads 122. Consequently, the redistribution circuit layer 164 may be formed electrically coupled to the first die 110' and the second die 120'. After the redistribution circuit layer 164 is formed, the external connectors 166 may thereafter be formed over the exposed metallization wirings 164*w* of the redistribution circuit layer 164 (e.g. by a BGA mounting process). Following this, the structure shown in FIG. 7G may be singulated or diced, thereby forming a plurality of packages, each of which may be substantially identical to the semiconductor structure 100C shown in FIG. 6.

In the present disclosure, the interconnection die may be bonded to the first die and the second die through direct contact of the bonding structures and forming bonding interface including a dielectric-to-dielectric bonding interface and a metal-to-metal bonding interface between the bonding structures. Therefore, the first die and the second die may be connected through the interconnection die without being connected to additional redistribution wiring and without solder. As such, the processing rate of the semiconductor structure may be improved, and the heat consumption may be reduced.

A structure including a first die, a second die, a first insulating encapsulant, an interconnection die, and a second insulating encapsulant is provided. The first die includes a first bonding structure. The first bonding structure includes a first dielectric layer and a first conductive pad embedded in the first dielectric layer. The second die includes a second bonding structure. The second bonding structure includes a second dielectric layer and a second conductive pad embedded in the second dielectric layer. The first insulating encapsulant laterally encapsulates the first die and the second die. The interconnection die includes a third bonding structure. The third bonding structure includes a third dielectric layer and third conductive pads embedded in the third dielectric layer. The second insulating encapsulant laterally encapsulates the interconnection die. The third bonding structure is in contact with the first bonding structure and the second bonding structure. In some embodiments, a first portion of the third conductive pads are in contact with the first conductive pad, and a second portion of the third conductive pads are in contact with the second conductive pad, and the third dielectric layer is in contact with the first dielectric layer and the second dielectric layer. In some embodiments, the interconnection die is in contact with the first insulating encapsulant and the second insulating encapsulant. In some embodiments, the first die is in contact with the first insulating encapsulant and the second insulating encapsulant. In some embodiments, the first insulating encapsulant is in contact with the second insulating encapsulant. In some embodiments, a thickness of the first insulating encapsulant is substantially equal to a height of the first die. In some embodiments, a first surface of the first bonding structure in contact with the third bonding structure, a second surface of the second bonding structure in contact with the third bonding structure, and a top surface of the first insulating encapsulant facing the interconnection die are substantially coplanar. In some embodiments, a shortest distance between the first die and the interconnection die is zero, and a shortest distance between the second die and the interconnection die is zero. In some embodiments, the structure further includes a redistribution circuit layer disposed over the first die, the second die, and the interconnection die. The first die is electrically coupled to the redistribution circuit layer. In some embodiments, the structure further includes a through via penetrating through the second insulating encapsulant. The through via is in contact with the first bonding structure.

A structure including a first die, a second die, and an interconnection die is provided. The first die includes a first bonding structure. The first bonding structure includes a first dielectric layer and first conductive pads embedded in the first dielectric layer. The first bonding structure includes a first periphery region and a first central region. The second die includes a second bonding structure. The second bonding structure includes a second dielectric layer and second conductive pads embedded in the second dielectric layer. The second bonding structure includes a second periphery region and a second central region. The interconnection die includes a third bonding structure. The third bonding structure includes a third dielectric layer and third conductive pads embedded in the third dielectric layer. The third bonding structure is in contact with the first bonding structure in the first periphery region and in contact with the second bonding structure in the second periphery region. An arrangement pitch of the first conductive pads in the first periphery region is finer than an arrangement pitch of the first conductive pads in the first central region. An arrangement pitch of the second conductive pads in the second periphery region is finer than an arrangement pitch of the second conductive pads in the second central region. In some embodiments, a shortest distance between the first periphery region and the second die is shorter than a shortest distance between the first central region and the second die. In some embodiments, a shortest distance between the second periphery region and the first die is shorter than a shortest distance between the second central region and the first die. In some embodiments, a minimum size of the first conductive pads in the first periphery region is smaller than a minimum size of the first conductive pads in the first central region, and a minimum size of the second conductive pads in the second periphery region is smaller than a minimum size of the second conductive pads in the second central region. In some embodiments, the structure further includes an insulating encapsulant and a through via penetrating through the insulating encapsulant. The through via is in contact with the first conductive pads in the first periphery region.

A method includes the following steps. Providing a first die and a second die, the first die having a first bonding structure, and the second die having a second bonding structure. Stacking an interconnection die over the first die and the second die, the interconnection die having a third bonding structure. Bonding the interconnection die to the first die and the second die, such that a first bonding interface includes a dielectric-to-dielectric bonding interface and a metal-to-metal bonding interface is formed between the third bonding structure and the first bonding structure, and a second bonding interface includes a dielectric-to-dielectric bonding interface and a metal-to-metal bonding interface is formed between the third bonding structure and the second bonding structure. And forming a redistribution circuit layer over and electrically coupled to the first die. In some embodiments, the method further includes providing the first die and the second die over a substrate. In some embodiments, the method further includes laterally encapsulating the first die and the second die with a first encapsulating material, and partially removing the first encapsulating material to reveal the first bonding structure and the second bonding structure. In some embodiments, the first encapsulating material including oxide. In some embodiments, the method further includes forming a through via on the first bonding structure, and laterally encapsulating the interconnection die and the through via with a second encapsulating material.

According to some embodiments, a semiconductor structure includes a first die, a first encapsulant, a second die and a second encapsulant. The first die includes a first dielectric layer and first conductive pads in the first dielectric layer. The first encapsulant laterally encapsulates and is in direct contact with the first dielectric layer of the first die. The second die includes a second dielectric layer and second conductive pads in the second dielectric layer. The second encapsulant laterally encapsulates and is in direct contact with the second dielectric layer of the second die. The first conductive pads of the first die are in physical contact with a first portion of the second conductive pads of the second die.

According to some embodiments, a semiconductor structure includes a first die, a second die, an interconnection die, a first encapsulant and a second encapsulant. The first die includes a first bonding structure, and the first bonding structure includes a first dielectric layer and first conductive pads in the first dielectric layer. The second die includes a second bonding structure, and the second bonding structure includes a second dielectric layer and second conductive pads in the second dielectric layer. The interconnection die includes a third bonding structure, and the third bonding structure includes a third dielectric layer and third conductive pads in the third dielectric layer. The first encapsulant laterally encapsulates and is in direct contact with the first dielectric layer and the second dielectric layer of the first die and the second die. The second encapsulant laterally encapsulates and is in direct contact with the third dielectric layer of the interconnection die, wherein the first encapsulant is in direct contact with the second encapsulant.

According to some embodiments, a method includes the following steps. A first die is provided, and the first die has a first bonding structure. A second die is stacked over the first die, and the second die has a second bonding structure. The second die is bonded to the first die, wherein there is no solder between the first die and the second die. A redistribution circuit layer is formed over and electrically coupled to the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
- a first die comprising a first dielectric layer and first conductive pads in the first dielectric layer;
- a first encapsulant, laterally encapsulating and in direct contact with the first dielectric layer of the first die;
- a second die comprising a second dielectric layer and second conductive pads in the second dielectric layer; and
- a second encapsulant, laterally encapsulating and in direct contact with the second dielectric layer of the second die;
- wherein the first conductive pads of the first die are in physical contact with a first portion of the second conductive pads of the second die.

2. The semiconductor structure as claimed in claim 1 further comprising a third die comprising a third dielectric layer and third conductive pads in the third dielectric layer, wherein a second portion of the second conductive pads are in contact with the third conductive pads, and the second dielectric layer is in contact with the first dielectric layer and the third dielectric layer, wherein surfaces of the first conductive pads and the first dielectric layer are substantially coplanar with surfaces of the first portion of the second conductive pads and the second dielectric layer.

3. The semiconductor structure as claimed in claim 1, wherein a surface of the second dielectric layer of the second die is in contact with the first encapsulant and sidewalls of the second die are in contact with the second encapsulant.

4. The semiconductor structure as claimed in claim 1, wherein sidewalls of the first die are in contact with the first encapsulant and a surface of the first dielectric layer of the first die is in contact with the second encapsulant.

5. The semiconductor structure as claimed in claim 1, wherein the first encapsulant is in contact with the second encapsulant.

6. The semiconductor structure as claimed in claim 1, wherein a thickness of the first encapsulant is substantially equal to a height of the first die.

7. The semiconductor structure as claimed in claim 1, wherein the second encapsulant covers a surface of the second die facing away from the first die.

8. The semiconductor structure as claimed in claim 1, wherein the first dielectric layer is not extended beyond a sidewall of the first die, and the second dielectric layer is not extended beyond a sidewall of the second die.

9. The semiconductor structure as claimed in claim 1 further comprising a redistribution circuit layer disposed over the first die and the second die, wherein the first die is electrically coupled to the redistribution circuit layer, and the first portion of the second conductive pads are disposed between the first die and the redistribution circuit layer.

10. The semiconductor structure as claimed in claim 1 further comprising a through via penetrating through the second encapsulant, wherein the through via is in contact with the first die, and a surface of the through via is substantially coplanar with surfaces of the second dielectric layer of the second die.

11. A semiconductor structure comprising:

a first die comprising a first bonding structure, the first bonding structure comprising a first dielectric layer and first conductive pads in the first dielectric layer;

a second die comprising a second bonding structure, the second bonding structure comprising a second dielectric layer and second conductive pads in the second dielectric layer;

an interconnection die comprising a third bonding structure, the third bonding structure comprising a third dielectric layer and third conductive pads in the third dielectric layer;

a first encapsulant, laterally encapsulating and in direct contact with the first dielectric layer and the second dielectric layer of the first die and the second die; and a second encapsulant, laterally encapsulating and in direct contact with the third dielectric layer of the interconnection die, wherein the first encapsulant is in direct contact with the second encapsulant.

12. The semiconductor structure as claimed in claim 11, wherein the first bonding structure includes a first periphery region and a first central region, an arrangement pitch of the first conductive pads in the first periphery region is finer than an arrangement pitch of the first conductive pads in the first central region, and an arrangement pitch of the second conductive pads in the second periphery region is finer than an arrangement pitch of the second conductive pads in the second central region.

13. The semiconductor structure as claimed in claim 12, wherein a shortest distance between the first periphery region and the second die is shorter than a shortest distance between the first central region and the second die, and a shortest distance between the second periphery region and the first die is shorter than a shortest distance between the second central region and the first die.

14. The semiconductor structure as claimed in claim 12, wherein a minimum size of the first conductive pads in the first periphery region is smaller than a minimum size of the first conductive pads in the first central region, and a minimum size of the second conductive pads in the second periphery region is smaller than a minimum size of the second conductive pads in the second central region.

15. The semiconductor structure as claimed in claim 11 further comprising a through via penetrating through the second encapsulant, wherein the through via is in contact with the first conductive pads in the first periphery region.

16. A semiconductor structure comprising:

a first die, comprising a first dielectric layer and first conductive patterns in the first dielectric layer;

a second die, comprising a second dielectric layer and second conductive patterns in the second dielectric layer, wherein the first conductive patterns and the second conductive patterns are bonded through a solder-less bonding, to bond the first die and the second die;

a first encapsulant, laterally encapsulating and interfacing with the first dielectric layer of the first die; and a second encapsulant, laterally encapsulating and interfacing with the second dielectric layer of the second die.

17. The semiconductor structure as claimed in claim 16, wherein the first conductive patterns comprises a plurality of first bonding pads and the second conductive patterns comprises a plurality of second bonding pads, and the first bonding layer is bonded to the second bonding layer and the first bonding pads are bonded to the second bonding pads respectively.

18. The semiconductor structure as claimed in claim 17, wherein a sidewall of one of the first bonding pads is substantially flush with a sidewall of one of the second bonding pads.

19. The semiconductor structure as claimed in claim 16, further comprising a plurality of though vias disposed in the second encapsulant to surround the second die.

20. The semiconductor structure as claimed in claim 16, further comprising a redistribution circuit layer over the second die and the second encapsulant, wherein the second die and the second encapsulant are disposed between the redistribution circuit layer and the first die and between the redistribution circuit layer and the first encapsulant.

* * * * *